United States Patent
Chan

(10) Patent No.: US 8,016,943 B2
(45) Date of Patent: *Sep. 13, 2011

(54) METHOD FOR PREPARING ATOMISTICALLY STRAIGHT BOUNDARY JUNCTIONS IN HIGH TEMPERATURE SUPERCONDUCTING OXIDES

(75) Inventor: Siu-Wai Chan, Demarest, NJ (US)

(73) Assignee: The Trustees of Columbia University in the City of New York, New York, NY (US)

( * ) Notice: Subject to any disclaimer, the term of this patent is extended or adjusted under 35 U.S.C. 154(b) by 607 days.

This patent is subject to a terminal disclaimer.

(21) Appl. No.: 11/945,529

(22) Filed: Nov. 27, 2007

(65) Prior Publication Data

US 2008/0119364 A1   May 22, 2008

Related U.S. Application Data

(63) Continuation of application No. 11/190,699, filed on Jul. 27, 2005, now Pat. No. 7,320,732, which is a continuation of application No. PCT/US03/02833, filed on Jan. 31, 2003.

(51) Int. Cl.
   *C30B 25/16*   (2006.01)

(52) U.S. Cl. ............ 117/84; 117/89; 117/90; 117/92; 117/93; 117/94

(58) Field of Classification Search ............ 117/84, 117/89, 90, 92, 93, 94
See application file for complete search history.

(56) References Cited

U.S. PATENT DOCUMENTS

| | | |
|---|---|---|
| 5,278,140 A | 1/1994 | Chaudhari et al. |
| 5,348,935 A | 9/1994 | Morris |
| 5,492,886 A | 2/1996 | Morris |
| 5,696,392 A | 12/1997 | Char et al. |
| 5,856,205 A | 1/1999 | Kugai |
| 5,981,443 A | 11/1999 | Wen |
| 6,191,073 B1 | 2/2001 | Hojczyk et al. |
| 6,422,473 B1 | 7/2002 | Ikefuji et al. |
| 7,320,732 B2 * | 1/2008 | Chan .................... 117/101 |
| 2003/0080345 A1 | 5/2003 | Motoki et al. |

* cited by examiner

*Primary Examiner* — Robert M Kunemund
(74) *Attorney, Agent, or Firm* — Baker Botts LLP

(57) ABSTRACT

A method for preparing film oxides deposited on a substrate with a resulting grain boundary junction that is atomistically straight. A bicrystal substrate having a straight grain boundary is prepared as a template. The Miller indices h1, k1, h2, k2 of the two grains of the substrate are chosen such that the misorientation angle of the film is equal to arctan k1/h1+ arctan k2/h2. The film is grown on the substrate using a layer-by-layer growth mode.

21 Claims, 24 Drawing Sheets

Table 1. The grain boundaries of different misorientations and inclinations, and the measured critical current density across them

| Sample | GB notation | $\alpha_1/\alpha_2(°)$ | $\Theta(°)$ | $J_c(A/cm^2)$ |
|---|---|---|---|---|
| a | $(100)_1/(210)_2$ | 0/26 | 26 | $8.33 \times 10^4$ |
| b | $(310)_1/(510)_2$ | 18/11 | 29 | $1.05 \times 10^5$ |
| c | $(410)_1/(310)_2$ | 14/18 | 32 | $5.14 \times 10^3$ |
| d | $(510)_1/(210)_2$ | 11/26 | 37 | $1.69 \times 10^3$ |
| e | $(210)_1/(410)_2$ | 26/14 | 40 | $8.39 \times 10^2$ |
| f | $(210)_1/(316)_2$ | 26/18 | 44 | $2.82 \times 10^2$ |

Figure 10

Table 2. The observed facets along the investigated grain boundaries

| Sample | GB notation | Designed $\alpha_1/\alpha_2$ (°) | Θ (°) | Observed (hkl) | Observed $\alpha_1/\alpha_2$ (°) |
|---|---|---|---|---|---|
| a | $(100)_1/(210)_2$ | 0/26 | 26 | $(100)_1/(210)_2$ | 0/26 |
| | | | | $(2\bar{1}0)_1/(100)_2$ | 26/0 |
| | | | | $(310)_1/(110)_2$ | −18/45 |
| | | | | $(510)_1/(430)_2$ | −11/39 |
| | | | | $(3\bar{1}0)_1/(710)_2$ | 18/8 |
| | | | | $(5\bar{1}0)_1/(410)_2$ | 11/14 |
| b | $(310)_1/(510)_2$ | 18/11 | 29 | $(100)_1/(530)_2$ | 0/31 |
| | | | | $(3\bar{1}0)_1/(510)_2$ | 18/11 |
| | | | | $(5\bar{1}0)_1/(310)_2$ | 11/18 |
| | | | | $(4\bar{1}0)_1/(410)_2$ | 14/14 |
| | | | | $(5\bar{2}0)_1/(710)_2$ | 21/8 |
| | | | | $(5\bar{3}0)_1/(100)_2$ | 30/0 |
| c | $(410)_1/(310)_2$ | 14/18 | 32 | $(9\bar{1}0)_1/(210)_2$ | 6/26 |
| | | | | $(2\bar{1}0)_1/(910)_2$ | 26/6 |
| | | | | $(3\bar{1}0)_1/(410)_2$ | 18/14 |
| | | | | $(4\bar{1}0)_1/(310)_2$ | 14/18 |
| | | | | $(5\bar{1}0)_1/(520)_2$ | 11/21 |
| | | | | $(5\bar{2}0)_1/(510)_2$ | 21/11 |
| | | | | $(5\bar{3}0)_1/(100)_2$ | 31/0 |
| | | | | $(100)_1/(530)_2$ | 0/31 |
| | | | | $(410)_1/(110)_2$ | −14/45 |
| d | $(510)_1/(210)_2$ | 11/26 | 37 | $(100)_1/(540)_2$ | 0/38 |
| | | | | $(5\bar{4}0)_1/(100)_2$ | 38/0 |
| | | | | $(2\bar{1}0)_1/(510)_2$ | 26/11 |
| | | | | $(5\bar{1}0)_1/(210)_2$ | 11/26 |
| | | | | $(3\bar{1}0)_1/(310)_2$ | 18/18 |
| | | | | $(4\bar{1}0)_1/(520)_2$ | 14/22 |
| | | | | $(5\bar{2}0)_1/(410)_2$ | 22/14 |

Figure 11

Table 2. The observed facets along the investigated grain boundaries

| Sample | GB notation | Designed $\alpha_1/\alpha_2$ (°) | Θ (°) | Observed (hkl) | Observed $\alpha_1/\alpha_2$ (°) |
|---|---|---|---|---|---|
| e | $(210)_1/(410)_2$ | 26/14 | 40 | $(2\bar{1}0)_1/(410)_2$ | 26/14 |
| | | | | $(4\bar{1}0)_1/(210)_2$ | 14/26 |
| | | | | $(100)_1/(650)_2$ | 0/40 |
| | | | | $(3\bar{1}0)_1/(520)_2$ | 18/22 |
| | | | | $(5\bar{2}0)_1/(310)_2$ | 22/18 |
| | | | | $(540)_1/(100)_2$ | 39/0 |
| f | $(210)_1/(310)_2$ | 26/18 | 44 | $(1\bar{1}0)_1/(100)_2$ | 45/0 |
| | | | | $(100)_1/(110)_2$ | 0/45 |
| | | | | $(2\bar{1}0)_1/(310)_2$ | 26/18 |
| | | | | $(3\bar{1}0)_1/(210)_2$ | 18/26 |
| | | | | $(4\bar{1}0)_1/(530)_2$ | 14/31 |
| | | | | $(5\bar{3}0)_1/(410)_2$ | 31/14 |
| | | | | $(3\bar{2}0)_1/(510)_2$ | 33/11 |
| | | | | $(5\bar{1}0)_1/(320)_2$ | 11/33 |

Figure 11 (Cont.)

Table 3. Calculated facets for the 0/26 boundary, i.e., GB// $(100)_1/(210)_2$, $\Theta=26.56°$, $\alpha_1^m=0°$, $\alpha_2^m=26.56°$

| $k_1^o/h_1^o$ | $\alpha_1^o$ | $k_2^o/h_2^o$ | $\alpha_2^o$ | $\alpha_1^o+\alpha_2^o$ | $\Delta\Theta=|\alpha_1^o+\alpha_2^o-\Theta|$ | $\phi_a=|\alpha_1^o-\alpha_1^m|$ | $d_{eff}$ | Observation | $J(\alpha)=\cos2\alpha_1^o\cos2\alpha_2^o/\cos\phi_a$ |
|---|---|---|---|---|---|---|---|---|---|
| 0/1 | 0 | 1/2 | 26.57 | 26.57 | 0.01 | 0 | 2.785 | yes | 0.60 |
| 1/1 | -45 | 3/1 | 71.56 | 26.56 | 0 | 45 | 1.97 | no | 0.00 |
| -1/1 | 45 | -1/3 | -18.43 | 26.57 | 0.01 | 45 | 1.97 | no | 0.00 |
| 1/2 | -26.57 | 4/3 | 53.13 | 26.56 | 0 | 26.57 | 1.245 | no | -0.19 |
| -1/2 | 26.57 | 0/1 | 0 | 26.57 | 0.01 | 26.57 | 2.785 | yes | 0.67 |
| 1/3 | -18.43 | 1/1 | 45 | 26.57 | 0.01 | 18.43 | 1.97 | yes | 0.00 |
| -1/3 | 18.43 | 1/7 | 8.13 | 26.56 | 0 | 18.43 | 0.88 | yes | 0.81 |
| 1/4 | -14.04 | 5/6 | 39.81 | 25.77 | 0.79 | 14.04 | 0.71 | no | 0.16 |
| -1/4 | 14.04 | 2/9 | 12.69 | 26.73 | 0.17 | 14.04 | 0.675 | no | 0.82 |
| 1/5 | -11.31 | 3/4 | 36.86 | 25.55 | 1.01 | 11.31 | 0.765 | yes | 0.26 |
| -1/5 | 11.31 | 1/4 | 14.04 | 25.35 | 1.21 | 11.31 | 0.845 | yes | 0.83 |
| 2/3 | -33.69 | 7/4 | 60.25 | 26.56 | 0 | 33.69 | 0.8 | no | -0.23 |
| -2/3 | 33.69 | -1/8 | -7.13 | 26.56 | 0 | 33.69 | 0.775 | no | 0.45 |
| 2/5 | -21.8 | 6/5 | 50.19 | 28.39 | 1.83 | 21.8 | 0.6 | no | -0.14 |
| -2/5 | 21.8 | 7/80 | 5 | 26.8 | 0.24 | 21.8 | 0.379 | no | 0.77 |
| 3/5 | -30.69 | 3/2 | 56.3 | 25.61 | 0.95 | 30.69 | 0.865 | no | -0.21 |
| -3/5 | 30.69 | -7/80 | -5 | 25.96 | 0.6 | 30.69 | 0.354 | no | 0.54 |
| 4/5 | -38.66 | 2/1 | 63.43 | 24.77 | 1.79 | 38.66 | 1.16 | no | -0.17 |
| -4/5 | 38.66 | -1/5 | -11.31 | 27.35 | 0.79 | 38.66 | 0.68 | no | 0.26 |

Figure 12

Table 4. Calculated facets for the 18/11 boundary, i.e., GB// $(310)_1 / (510)_2$, $\Theta=29.74°$ ($\alpha_1^m=18.43°$, $\alpha_2^m=11.31°$)

| $k_1^o/h_1^o$ | $\alpha_1^o$ | $k_2^o/h_2^o$ | $\alpha_2^o$ | $\alpha_1^o+\alpha_2^o$ | $\Delta\Theta=\|\alpha_1^o+\alpha_2^o-\Theta\|$ | $\phi_o=\|\alpha_1^o-\alpha_1^m\|$ | $d_{eff}$ | Observation | $J(\alpha)=\cos 2\alpha_1^o \cos 2\alpha_2^o / \cos\phi_o$ |
|---|---|---|---|---|---|---|---|---|---|
| 0/1 | 0 | 3/5 | 30.96 | 30.96 | 1.22 | 18.43 | 2.255 | yes | 0.50 |
| 1/1 | -45 | 7/2 | 74.05 | 29.05 | 0.69 | 63.43 | 1.625 | no | 0.00 |
| -1/1 | 45 | -1/4 | -14.04 | 30.96 | 1.22 | 26.57 | 1.22 | no | 0.00 |
| 1/2 | -26.57 | 3/2 | 56.31 | 29.74 | 0 | 45 | 1.395 | no | -0.33 |
| -1/2 | 26.57 | 0/1 | 0 | 26.57 | 3.17 | 8.14 | 2.785 | no | 0.61 |
| 1/3 | -18.43 | 1/1 | 45 | 26.57 | 3.17 | 36.86 | 1.97 | no | 0.00 |
| -1/3 | 18.43 | 1/5 | 11.31 | 29.74 | 0 | 0 | 0.99 | yes | 0.74 |
| 1/4 | -14.04 | 1/1 | 45 | 30.96 | 1.22 | 32.47 | 1.825 | no | 0.00 |
| -1/4 | 14.04 | 1/4 | 14.04 | 28.08 | 1.66 | 4.39 | 0.93 | yes | 0.78 |
| 1/5 | -11.31 | 1/1 | 45 | 33.69 | 3.95 | 29.74 | 1.74 | no | 0.00 |
| -1/5 | 11.31 | 1/3 | 18.43 | 29.74 | 0 | 7.12 | 0.99 | yes | 0.74 |
| 2/3 | -33.69 | -2/1 | 63.43 | 29.74 | 0 | 52.12 | 1.395 | no | -0.38 |
| -2/3 | 33.69 | 0/1 | 0 | 33.69 | 3.95 | 15.26 | 2.46 | no | 0.40 |
| 2/5 | -21.8 | 5/4 | 51.34 | 29.54 | 0.2 | 40.23 | 0.655 | no | -0.21 |
| -2/5 | 21.8 | 1/7 | 8.13 | 29.93 | 0.19 | 3.37 | 0.625 | yes | 0.70 |
| 3/5 | -30.69 | 7/4 | 60.26 | 29.57 | 0.17 | 49.12 | 0.57 | no | -0.37 |
| -3/5 | 30.96 | 0/1 | 0 | 30.96 | 1.22 | 12.53 | 2.255 | yes | 0.48 |
| 4/5 | -38.66 | 5/2 | 68.2 | 29.54 | 0.2 | 57.09 | 0.655 | no | -0.29 |
| -4/5 | 38.66 | -1/7 | -7.94 | 30.72 | 0.98 | 20.23 | 0.57 | no | 0.23 |

Figure 13

Table 5. Calculated facets for the 14/18 boundary, i.e., GB// (410)₁/(310)₂, θ=32.47°, $α_1^m$=14.14°, $α_2^m$=18.43°

| $k_1^0/h_1^0$ | $α_1^0$ | $k_2^0/h_2^0$ | $α_2^0$ | $α_1^0+α_2^0$ | $Δθ=|α_1^0+α_2^0-θ|$ | $φ_α=|α_1^0-α_1^m|$ | $d_{eff}$ | Observation | $J(α)=\cos2α_1^0\cos2α_2^0/\cosφ_α$ |
|---|---|---|---|---|---|---|---|---|---|
| 0/1 | 0 | 3/5 | 30.96 | 30.96 | 1.51 | 14.04 | 2.25 | yes | 0.49 |
| 1/1 | -45 | 4/1 | 75.96 | 30.96 | 1.51 | 59.04 | 1.825 | no | 0.00 |
| -1/1 | 45 | -1/4 | -14.04 | 30.96 | 1.51 | 30.96 | 1.825 | no | 0.00 |
| 1/2 | -26.57 | 5/3 | 59.04 | 32.47 | 0 | 40.61 | 1.825 | no | -0.37 |
| -1/2 | 26.57 | 1/9 | 6.34 | 32.91 | 0.44 | 12.53 | 1.075 | yes | 0.60 |
| 1/3 | -18.43 | 6/5 | 50.19 | 31.76 | 0.71 | 32.47 | 0.855 | no | -0.17 |
| -1/3 | 18.43 | 1/4 | 14.04 | 32.47 | 0 | 4.39 | 1.075 | yes | 0.71 |
| 1/4 | -14.04 | 1/1 | 45 | 30.96 | 1.51 | 28.08 | 1.825 | yes | 0.00 |
| -1/4 | 14.04 | 1/3 | 18.43 | 32.47 | 0 | 0 | 1.075 | yes | 0.71 |
| 1/5 | -11.31 | 1/1 | 45 | 33.69 | 1.22 | 25.35 | 1.74 | no | 0.00 |
| -1/5 | 11.31 | 2/5 | 21.8 | 33.11 | 0.64 | 2.73 | 0.735 | yes | 0.67 |
| 2/3 | -33.69 | 5/2 | 68.19 | 34.5 | 2.03 | 47.73 | 0.89 | no | -0.41 |
| -2/3 | 33.69 | 0/1 | 0 | 33.69 | 1.22 | 19.65 | 2.46 | yes | 0.41 |
| 2/5 | -21.8 | 4/3 | 53.13 | 31.33 | 1.14 | 35.84 | 0.74 | no | -0.25 |
| -2/5 | 21.8 | 1/5 | 11.31 | 33.11 | 0.64 | 7.76 | 0.735 | yes | 0.67 |
| 3/5 | -30.69 | 2/1 | 63.43 | 32.74 | 0.27 | 44.73 | 1.185 | no | -0.40 |
| -3/5 | 30.96 | 0/1 | 0 | 30.96 | 1.51 | 16.92 | 2.25 | yes | 0.49 |
| 4/5 | -38.66 | 3/1 | 71.56 | 32.9 | 0.43 | 52.7 | 0.91 | yes | -0.29 |
| -4/5 | 38.66 | -1/9 | -6.34 | 32.32 | 0.15 | 24.62 | 0.515 | no | 0.24 |
| -1/9* | 6.34 | 1/2 | 26.57 | 32.91 | 0.44 | 7.7 | 1.075 | yes | 0.59 |

* THE DESIGNED MAXIMUM VALUE FOR $h_{-1}$ AND $k_{-1}$ IS 5. THIS EXCEPTION IS CALCULATED IN ORDER TO COMPARE WITH THE EXPERIMENT.

Figure 14

Table 6. Calculated facets for the 11/26 boundary, i.e., GB// (510)$_1$/(210)$_2$, Θ=37.87°, $α_1^m$=11.31°, $α_2^m$=26.56°

| $k_1^a/h_1^a$ | $α_1^a$ | $k_2^a/h_2^a$ | $α_2^a$ | $α_1^a+α_2^a$ | $\Delta\Theta=|α_1^a+α_2^a-\Theta|$ | $\phi_a=|α_1^a-α_1^m|$ | $d_{eff}$ | Observation | $J(α)=\cos2α_1^a\cos2α_2^a/\cos\phi_a$ |
|---|---|---|---|---|---|---|---|---|---|
| 0/1 | 0 | 4/5 | 38.66 | 38.66 | 0.79 | 11.31 | 2.225 | yes | 0.22 |
| 1/1 | -45 | 8/1 | 82.87 | 37.87 | 0 | 56.31 | 1.6 | no | 0.00 |
| -1/1 | 45 | -1/8 | -7.12 | 37.88 | 0.01 | 33.69 | 1.6 | no | 0.00 |
| 1/2 | -26.57 | 2/1 | 63.43 | 36.86 | 1.01 | 37.88 | 1.72 | no | -0.46 |
| -1/2 | 26.57 | 1/5 | 11.31 | 37.88 | 0.01 | 15.26 | 1.24 | yes | 0.57 |
| 1/3 | -18.43 | 3/2 | 56.3 | 37.87 | 0 | 29.74 | 1.145 | no | -0.35 |
| -1/3 | 18.43 | 1/3 | 18.43 | 36.86 | 1.01 | 7.12 | 1.22 | yes | 0.65 |
| 1/4 | -14.04 | 4/3 | 53.13 | 39.09 | 1.22 | 25.35 | 0.85 | no | -0.27 |
| -1/4 | 14.04 | 2/5 | 21.8 | 35.84 | 2.03 | 2.73 | 0.82 | yes | 0.64 |
| 1/5 | -11.31 | 6/5 | 50.19 | 38.88 | 1.01 | 22.62 | 0.625 | no | -0.18 |
| -1/5 | 11.31 | 1/2 | 26.57 | 37.88 | 0.01 | 0 | 1.24 | yes | 0.55 |
| 2/3 | -33.69 | 3/1 | 71.56 | 37.87 | 0 | 45 | 1.145 | no | -0.44 |
| -2/3 | 33.69 | 7/90 | 4.45 | 38.14 | 0.27 | 22.38 | 0.56 | no | 0.41 |
| 2/5 | -21.8 | 5/3 | 59.04 | 37.24 | 0.63 | 33.11 | 0.685 | no | -0.41 |
| -2/5 | 21.8 | 1/4 | 14.04 | 35.84 | 2.03 | 10.49 | 0.82 | yes | 0.65 |
| 3/5 | -30.69 | 5/2 | 68.19 | 37.5 | 0.37 | 42 | 0.685 | no | -0.47 |
| -3/5 | 30.96 | 1/8 | 7.12 | 38.08 | 0.21 | 19.65 | -0.57 | no | 0.48 |
| 4/5 | -38.66 | 4/1 | 75.96 | 37.3 | 0.57 | 49.97 | 0.765 | no | -0.30 |
| -4/5 | 38.66 | 0/1 | 0 | 38.66 | 0.79 | 27.35 | 2.225 | yes | 0.25 |

Figure 15

Table 7. Calculated facets for the 26/14 boundary, i.e., GB// $(210)_1/(310)_2$, $\theta=40.66°$, $\alpha_1^m=26.56°$, $\alpha_2^m=14.04°$

| $k_1^a/h_1^a$ | $\alpha_1^a$ | $k_2^a/h_2^a$ | $\alpha_2^a$ | $\alpha_1^a+\alpha_2^a$ | $\Delta\theta=\|\alpha_1^a+\alpha_2^a-\theta\|$ | $\psi_0=\|\alpha_1^a-\alpha_1^m\|$ | $d_{eff}$ | Observation | $j(\alpha)=\cos2\alpha_1^a\cos2\alpha_2^a/\cos\phi_0$ |
|---|---|---|---|---|---|---|---|---|---|
| 0/1 | 0 | 516 | 39.81 | 39.81 | 0.79 | 26.56 | 2.17 | yes | 0.20 |
| 1/1 | -45 | 80/7 | 85 | 40 | 0.6 | 71.56 | 1.385 | no | 0.00 |
| -1/1 | 45 | -7/80 | -5 | 40 | 0.6 | 18.44 | 1.385 | no | 0.00 |
| 1/2 | -26.57 | 7/3 | 60.8 | 40.23 | 0.37 | 53.13 | 1.115 | yes | -0.69 |
| -1/2 | 26.57 | 1/4 | 14.04 | 40.61 | 0.01 | 0.01 | 1.325 | no | 0.53 |
| 1/3 | -18.43 | 5/3 | 59.03 | 40.6 | 0 | 44.99 | 0.94 | yes | -0.53 |
| -1/3 | 18.43 | 2/5 | 21.8 | 40.23 | 0.37 | 8.13 | 0.965 | yes | 0.59 |
| 1/4 | -14.04 | 7/5 | 54.46 | 40.42 | 0.18 | 40.6 | 0.69 | no | -0.38 |
| -1/4 | 14.04 | 1/2 | 26.57 | 40.61 | 0.01 | 12.52 | 1.325 | yes | 0.54 |
| 1/5 | -11.31 | 5/4 | 51.34 | 40.03 | 0.57 | 37.87 | 0.68 | no | -0.26 |
| -1/5 | 11.31 | 5/9 | 29.05 | 40.36 | 0.24 | 15.25 | 0.565 | no | 0.51 |
| 2/3 | -33.69 | 7/2 | 74.05 | 40.36 | 0.24 | 60.25 | 0.8 | no | -0.66 |
| -2/3 | 33.69 | 1/9 | 6.34 | 40.03 | 0.57 | 7.13 | 0.75 | no | 0.38 |
| 2/5 | -21.8 | 2/1 | 63.43 | 41.63 | 1.03 | 48.36 | 1.215 | no | -0.65 |
| -2/5 | 21.8 | 1/3 | 18.43 | 40.23 | 0.37 | 4.76 | 0.965 | yes | 0.58 |
| 3/5 | -30.69 | 3/1 | 71.56 | 40.87 | 0.27 | 57.25 | 0.94 | no | -0.71 |
| -3/5 | 30.96 | 1/6 | 9.46 | 40.42 | 0.18 | 4.4 | 0.645 | no | 0.45 |
| 4/5 | -38.66 | 5/1 | 78.69 | 40.03 | 0.57 | 65.22 | 0.68 | no | -0.48 |
| -4/5 | 38.66 | 0/1 | 0 | 38.66 | 1.94 | 12.1 | 2.225 | yes | 0.23 |

Figure 16

Table 8. Calculated facets for the 26/18 boundary, i.e., GB//$(210)_1$/$(310)_2$, $\Theta=49.99°$, $\alpha_1^m=26.56°$, $\alpha_2^m=18.43°$

| $k_1^a/h_1^a$ | $\alpha_1^a$ | $k_2^a/h_2^a$ | $\alpha_2^a$ | $\alpha_1^a+\alpha_2^a$ | $\Delta\Theta=|\alpha_1^a+\alpha_2^a-\Theta|$ | $\psi_a=|\alpha_1^a-\alpha_1^m|$ | $d_{eff}$ | Observation | $J(\alpha)=\cos2\alpha_1^a\cos2\alpha_2^a/\cos\phi_0$ |
|---|---|---|---|---|---|---|---|---|---|
| 0/1 | 0 | 1/1 | 45 | 45 | 0.01 | 26.56 | 3.285 | yes | 0.00 |
| 1/1 | -45 | 1/0 | 90 | 45 | 0.01 | 71.56 | 3.285 | no | 0.00 |
| -1/1 | 45 | 0/1 | 0 | 45 | 0.01 | 18.44 | 3.285 | yes | 0.00 |
| 1/2 | -26.57 | 3/1 | 71.56 | 44.99 | 0 | 53.13 | 1.47 | no | -0.80 |
| -1/2 | 26.57 | 1/3 | 18.43 | 45 | 0.01 | 0.01 | 1.47 | yes | 0.48 |
| 1/3 | -18.43 | 2/1 | 63.43 | 45 | 0.01 | 44.99 | 1.47 | no | -0.68 |
| -1/3 | 18.43 | 1/2 | 26.57 | 45 | 0.01 | 8.13 | 1.47 | yes | 0.49 |
| 1/4 | -14.04 | 5/3 | 59.03 | 44.99 | 0 | 40.6 | 0.795 | no | -0.55 |
| -1/4 | 14.04 | 3/5 | 30.96 | 45 | 0.01 | 12.52 | 0.795 | yes | 0.43 |
| 1/5 | -11.31 | 3/2 | 56.3 | 44.99 | 0 | 37.87 | 0.915 | no | -0.45 |
| -1/5 | 11.31 | 2/3 | 33.69 | 45 | 0.01 | 15.25 | 0.915 | yes | 0.37 |
| 2/3 | -33.69 | 5/1 | 78.69 | 45 | 0.01 | 60.25 | 0.915 | no | -0.72 |
| -2/3 | 33.69 | 1/5 | 11.31 | 45 | 0.01 | 7.13 | 0.915 | yes | 0.36 |
| 2/5 | -21.8 | 7/3 | 66.8 | 45 | 0.01 | 48.36 | 0.61 | no | -0.75 |
| -2/5 | 21.8 | 3/7 | 23.19 | 44.99 | 0 | 4.76 | 0.61 | yes | 0.50 |
| 3/5 | -30.69 | 4/1 | 75.96 | 45.27 | 0.28 | 57.25 | 0.795 | no | -0.78 |
| -3/5 | 30.96 | 1/4 | 14.04 | 45 | 0.01 | 4.4 | 0.795 | yes | 0.42 |
| 4/5 | -38.66 | 9/1 | 83.65 | 44.99 | 0 | 65.22 | 0.515 | no | -0.51 |
| -4/5 | 38.66 | 9/1 | 6.34 | 45 | 0.01 | 12.1 | 0.515 | no | 0.22 |

Figure 17

METHOD FOR PREPARING ATOMISTICALLY STRAIGHT BOUNDARY JUNCTIONS IN HIGH TEMPERATURE SUPERCONDUCTING OXIDES

CROSS-REFERENCE TO RELATED APPLICATIONS

This application is a continuation of U.S. application Ser. No. 11/190,699, filed Jul. 27, 2005 now U.S. Pat. No. 7,320,732, entitled "Method For Preparing Atomistically Straight Boundary Junctions In High Temperature Superconducting Oxides," which is incorporated by reference in its entirety herein, and from which priority is claimed, which is a continuation of International Application No. PCT/US03/002833, filed Jan. 31, 2003, published Aug. 19, 2004, entitled "METHOD FOR PREPARING ATOMISTICALLY STRAIGHT BOUNDARY JUNCTIONS IN HIGH TEMPERATURE SUPERCONDUCTING OXIDES," which is incorporated by reference in its entirety herein, and from which priority is claimed.

FIELD OF THE INVENTION

The invention relates to superconducting thin film oxides. In particular, the present invention relates to a method of preparing thin film oxides deposited on a substrate with a resulting boundary junction that is atomistically straight.

BACKGROUND OF THE INVENTION

Most large-scale applications of high-$T_c$ superconductors (HTS) demand high critical current densities ($J_c$) and strong superconducting coupling across grain boundaries. It is known that grain boundaries in HTS (e.g., $YBa_2Cu_3O_{7-x}$, BiCaSrCuO, etc.) have an adverse effect on the transport properties. This effect is normally worsened when the grain misorientation increases, except for some special grain boundaries. It has been shown that $J_c$ across a grain boundary decreases exponentially as the misorientation angle ($\theta$) of the boundary increases. Several models have been proposed to account for this characteristic grain boundary behavior. In general, the presence of grain boundary dislocations has been used to explain the reduction of $J_c$ for small-angle grain boundaries ($\theta<15°$). High angle grain boundaries contain a disordered layer whose effective width was found to increase linearly with increasing misorientation. It has been suggested that the exponential decrease of $J_c$ is associated with this increase.

In addition to the misorientation angle, the inclination of the boundary plane, which defines the orientation of the main crystal axes with respect to the grain boundary, has an overriding influence on the critical current density. The $J_c$ value could vary by several orders of magnitude for a change of the boundary inclination of a given misorientation angle. Different from conventional superconductors, the high temperature superconducting cuprates have d-wave symmetry, which implies that the variation in inclination of the grain boundary plane alters the transport current across the interface. Using two extreme cases, it has been shown that the critical current density across the boundary can change from the Sigrist-Rice clean limit (facet free) to its dirty limit (maximum random facets). It has been urged that the facets along grain boundaries tend to alter the path of current transport since the inclination essentially determines the directionality of couplings across the boundary. The critical current density rapidly decreases with misorientation and has been explained by the combined effect of the d-wave pairing symmetry and the observed boundary meandering. However, the $J_c$ values obtained from these facet-related models still fail to match the experimental data of the rapid decrease of $J_c$ with misorientation angle. To explain these discrepancies, it has been proposed that the grain boundary plane can only take on discrete hkl inclinations and not arbitrary orientations during faceting. It has been suggested that the discretization of the boundary inclination is a result of a discrete crystal lattice and the nonperiodic nature of the faceting represents a more realistic boundary structure. Theoretically, the boundary inclination planes take the crystallographic planes with low hkl values from the discrete lattice point of view, depending on the misorientation of neighboring grains, chemical segregation and other effects.

While the electrical properties of the grain boundaries have been extensively studied, the microstructure of the HTS grain boundaries has not been well characterized. Many microstructural studies of the epitaxially grown grain boundaries have focused on the meandering nature of the film grain boundaries. The grain boundary meandering means a continuous change of the grain boundary plane, which results from the twists and turns of boundary at the microscopic scale. It is the faceting that defines the atomistic crystallographic plane of the grain boundary and thereby the change in the path of current transport. Although the observation of the nanoscale facets at grain boundaries of YBCO thin films grown on STO substrates has also been reported, the faceting mechanisms was not well understood and it was also not clear if the grain boundary faceting is a general and pervasive phenomenon.

Since many electronic devices that use superconductors require reproducible junction currents, the ability to produce uniform junctions is essential. In high temperature superconducting oxides, such as $YBa_2Cu_3O_{7-x}$ and BiCaSrCuO, the coherence length is very small comparable to the lattice parameters. Therefore, the atomic structure of the junctions is a controlling factor of the junction properties. The origin of the deviation of the electronic properties along a high angle grain boundary in high temperature superconducting films derives from the microscopic meandering and the nanoscopic faceting of the boundary. This meandering does not derive from the template bicrystal substrates, but from island growth mode of the films on the substrate surface resulting from the chosen deposition methods. Since off stoichiometric deposition of the oxide films is generally detrimental to superconducting properties, a deposition method must be used that allows congruent transfer of stoichiometric materials. In order to prepare a non-meandering boundary, not only does the template boundary need to be straight, but the thin film growth mode needs to be a layer-by-layer type. Therefore, a need exits in the art for a method of preparing thin film oxides deposited on a substrate with a bicrystal grain boundary that is completely straight and planar on a microscopic and atomistic level so the d-wave coupling across the boundary will not vary along the boundary, allowing the preparation of thin film oxides with a reproducible junction current.

SUMMARY OF THE INVENTION

The aforementioned need is substantially satisfied by the present invention which is a method for preparing thin film oxides deposited on a template bicrystal substrate having a straight boundary with a resulting boundary junction in the thin film that is atomistically straight. According to one exemplary embodiment of the present invention, a method of forming a thin film with an atomistically straight bicrystal grain boundary junction includes preparing a template bicrystal substrate having a straight bicrystal grain boundary. A straight template boundary is formed in the substrate by choosing a high angle tilt boundary where the misorientation angle is the sum of the inclination angles between a first grain of the substrate and a second grain of the substrate. A plane of the first grain of the substrate and a plane of the second grain of the substrate are chosen wherein the planes are parallel to the grain boundary, and the misorientation angle is equal to: $\arctan k_1/h_1 + \arctan k_2/h_2$, where $k_1$ and $h_1$ are Miller indices of the first grain of the substrate, and $k_2$ and $h_2$ are Miller indices of the second grain of the substrate. A thin film is then grown on the substrate in a layer-by-layer growth mode. In a further embodiment of the present invention, the layer-by-layer growth mode is achieved by a chosen deposition method and by the choice of substrate. In a still further embodiment of the present invention, the thin film is a high temperature super-conducting oxide thin film. In another embodiment of the present invention, $|h_1|$, $|k_1|$, $|h_2|$, $|k_2|$ are integers less than or equal to 5. In still another embodiment of the present invention, the thin film is deposited in a layer-by-layer growth mode stoichiometrically. In yet another embodiment of the present invention, the thin film is deposited in a layer-by-layer growth mode by a method selected from the group consisting of solution coating, molecular beam epitaxy, laser ablation, liquid phase epitaxy (LPE) and chemical vapor deposition (CVD).

BRIEF DESCRIPTION OF THE DRAWINGS

For a more complete understanding of the present invention and its advantages, reference is now made to the following description, taken in conjunction with the accompanying drawings, in which:

FIG. 1(*b*) is a view of FIG. 1(*a*) from [001] direction showing the angles $\alpha_1$ and $\alpha_2$ formed between the boundary plane and the a-axes of the two grains of a bicrystal thin film. To maintain $\alpha_1+\alpha_2=\theta$, $\alpha_1$ is defined as a positive value when the GB plane rotates clockwise away from the $a_1$, whereas $\alpha_2$ is a positive integer when the angle is formed by rotating the $a_2$ axis counterclockwise to the GB position;

FIG. 6(*b*) is an HRTEM image of the YBCO grain boundaries showing faceting along the 0/26 boundary;

FIG. 6(*c*) is an HRTEM image of the YBCO grain boundaries showing faceting along the 18/11 boundary;

FIG. 6(*d*) is an HRTEM image of the YBCO grain boundaries showing faceting along the 11/26 boundary;

FIG. 6(*e*) is an HRTEM image of the YBCO grain boundaries showing faceting along the 14/18 boundary;

FIG. 6(*f*) is an HRTEM image of the YBCO grain boundaries showing faceting along the 26/18 boundary;

FIG. 9(*b*) is a graphical plot showing a comparison between the experimentally observed facets (black dots) and the allowable facets not observed (small circles), $\Delta\theta>3°$, calculated based on a faceting mode for a designed inclination angle ratio ($\alpha_1^m/\alpha_2^m$) of 18/11;

FIG. 9(*c*) is a graphical plot showing a comparison between the experimentally observed facets (black dots) and the allowable facets not observed (small circles), $\Delta\theta>3°$, calculated based on a faceting mode for a designed inclination angle ratio ($\alpha_1^m/\alpha_2^m$) of 14/18;

FIG. 9(*d*) is a graphical plot showing a comparison between the experimentally observed facets (black dots) and the allowable facets not observed (small circles), $\Delta\theta>3'$, calculated based on a faceting mode for a designed inclination angle ratio ($\alpha_1^m/\alpha_2^m$) of 11/26;

FIG. 9(*e*) is a graphical plot showing a comparison between the experimentally observed facets (black dots) and the allowable facets not observed (small circles), $\Delta\theta>3'$, calculated based on a faceting mode for a designed inclination angle ratio ($\alpha_1^m/\alpha_2^m$) of 26/14; and FIG. 9(*f*) is a graphical plot showing a comparison between the experimentally observed facets (black dots) and the allowable facets not observed (small circles), $\Delta\theta>3'$, calculated based on a faceting mode for a designed inclination angle ratio ($\alpha_1^m/\alpha_2^m$) of 26/18.

FIG. 10 is a table (Table 1) listing selected measured parameters of sample thin films prepared in accordance with some embodiments of the disclosed subject matter.

FIG. 11 is a table (Table 2) listing observed facets along investigated grain boundaries of sample thin films prepared in accordance with some embodiments of the disclosed subject matter.

FIG. 12-17 are tables (Tables 3-8) listing calculated facets of grain boundaries of sample thin films prepared in accordance with some embodiments of the disclosed subject matter.

DETAILED DESCRIPTION

A method according to exemplary embodiments of the present invention will now be described with reference to the accompanying drawings.

A. Exemplary Embodiment

According to one exemplary embodiment of the present invention, $YBa_2Cu_3O_{7-x}$ (YBCO) thin films can be formed on [001] tilt $SrTiO_3$ (STO) bicrystal substrate templates having straight grain boundaries with a resulting boundary junction in the YBCO thin film that is atomistically straight. To avoid microscopic meandering the film is grown by a layer-by-layer method, and to avoid faceting the boundary plane is defined by the Miller indices $(h_1k_1 0)_1$, corresponding to a first grain in the YBCO film, and the Miller indices $(h_2k_2 0)_2$, corresponding to the second grain in the YBCO film, with sufficiently small $h_1, k_1, h_2, k_2$ (i.e., $|h_1|, |k_1|, |h_2|, |k_2| \leq 5$) and sufficiently large effective interplanar spacing (i.e., $d_{\mathit{eff}} > 0.06$ nm).

Figure 1A:
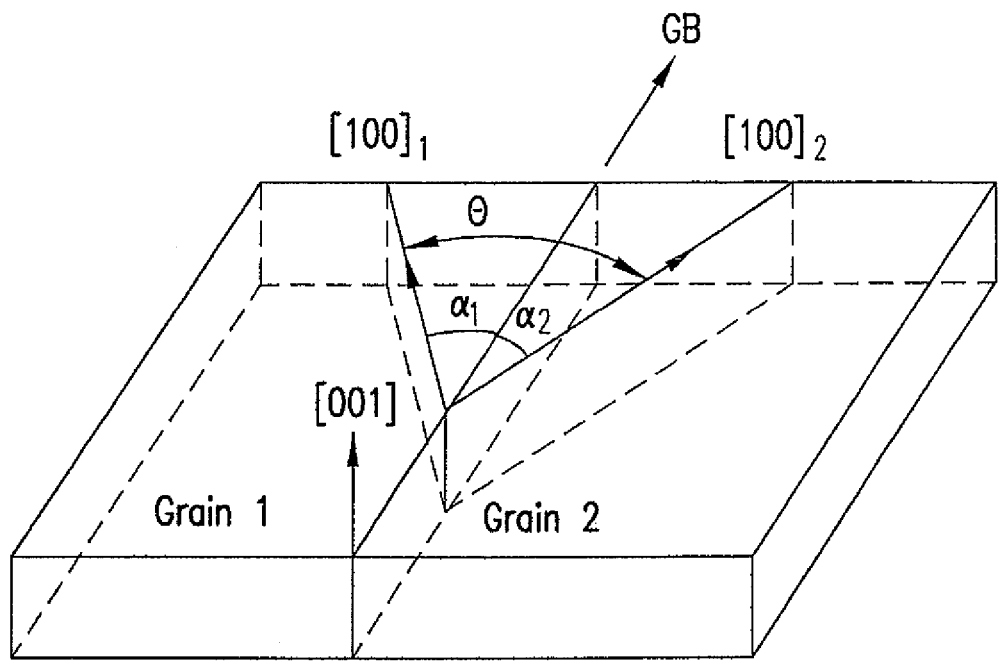
FIG. 1(*a*) is an exemplary diagram of the [001] tilt grain boundary (GB).
Figure 1B:
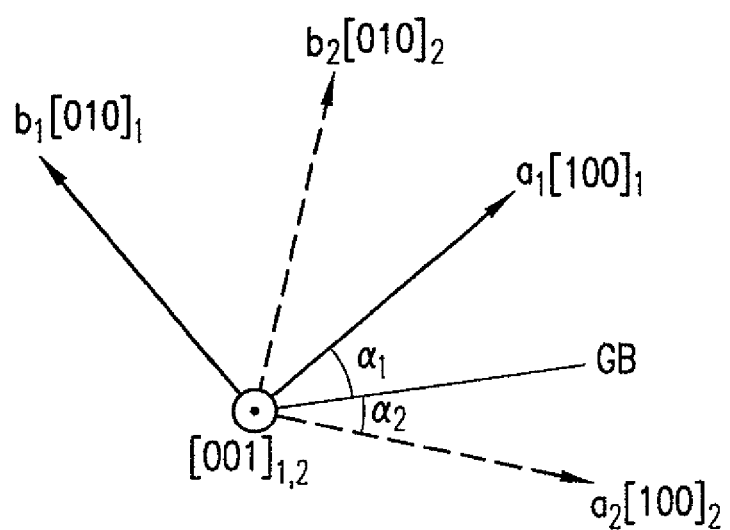

The geometry of the inclinations will define the misorientation angles of the boundary $(\alpha_1+\alpha_2=\theta)$, as shown in FIGS. 1A and 1B. To form a substrate with a desired misorientation angle $(\theta)$, a substrate crystal with Miller indices $(h_1k_1 0)_1$ may be cut with an inclination angle $(\alpha_1)$, a second substrate crystal with Miller indices $(h_2k_2 0)_2$ may be cut with an inclination angle $(\alpha_2)$ The substrate crystals may then be fused together to form a substrate (template) boundary plane with a misorientation angle that is the sum of the inclination angles of the substrate crystals. A straight boundary in the YBCO film can be prepared by arranging the Miller indices of the first and second crystals of the substrate $(h_1k_1 0)_1/(h_2k_2 0)_2$ such that arctan $k_1/h_1$ +arctan $k_2/h_2$ is equal to the misorientation angle, and then epitaxially growing the YBCO film on the substrate using a layer-by-layer growth mode.

The structure of [001] tilt boundaries in YBCO thin films deposited on [001] tilt STO bicrystal substrate templates, characterized by transmission electron microscopy (TEM), has boundaries of (100)/(210), (310)/(510), (410)/(310), (510)/(210), (210)/(410) and (210)/(310), with corresponding misorientation angles of 26°, 29°, 32°, 37°, 40° and 44°, respectively. This results in YBCO film boundaries that meander along the substantially straight template boundary of the bicrystal substrate. To avoid microscopic meandering a deposition method or a particular substrate can be chosen so that the film growth occurs in a stoichiometric layer-by-layer mode. Layer-by-layer growth of YBCO on STO can be obtained by using an ex-situ growth of the YBCO film, as described in P. C. McIntyre et al., *J. Mater. Res.*, 9, 2219 (1994) and S.-W. Chan et al., *Appl. Phys. Letters*, 53 (15), 1443 (1988). Alternatively, a metalorganic chemical vapor deposition (MOCVD) method can be used to obtain layer-by-layer growth of a YBCO film on an STO substrate. As a further alternative, molecular beam epitaxy (MBE) may be used to obtain layer-by-layer growth of YBCO film on an STO substrate. Island growth and layer-by-layer growth of epitaxial films on a substrate are well known in the art, and are described in M. Ohring, *Material Science of Thin Films*, 1st ed., p. 197, Academic Press (1992).

B. Implementation of the Exemplary Embodiment

The exemplary embodiment of the method of preparing YBCO thin films on [001] tilt STO bicrystal substrates with a resulting boundary junction that is atomistically straight can be understood by considering the undesirable high angle grain boundary faceting of YBCO during island film growth. A particular set of STO bicrystal grain boundaries can be designed so that the boundary planes are thermodynamically stable. The Jc's of the YBCO boundary junctions can be measured by scanning superconducting quantum interference device (SQUID) microscopy and are listed in Table 1.

Since the STO is both phase compatible and lattice matched with the YBCO, the grain boundary of YBCO film duplicates the grain boundary of the STO substrate template. To form a particular grain boundary, a c-axis oriented YBCO film can be deposited epitaxially on an STO template bicrystal by one of the methods of solution coating, MOCVD, liquid phase epitaxy (LPE) and MBE. The substrate crystal can be cut to obtain the desired inclination angles that give layer-by-layer growth, and fused together to form the substrate (template) boundary plane. By optimizing the growth parameters that promote the epitaxial growth of films on the substrates, the YBCO films can duplicate the template boundary structure of the substrates. Table 1 lists the (hk0) planes in each of the two grains of a bicrystal YBCO film (noted with subscript 1 for the first grain and 2 for the second grain) that are parallel to the common boundary plane and correspond to grain boundaries with misorientation angles ranging from 26° to 45°.

Figure 2A:
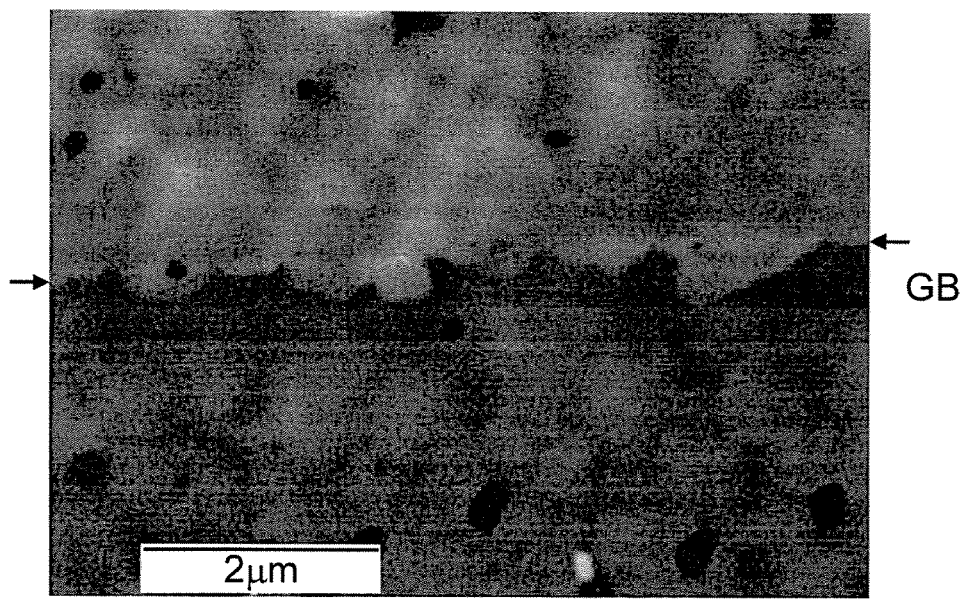
FIG. 2 shows the [001] low magnification plane-view images of the 14/18 YBCO grain boundary: (a) scanning electron microscope image, (b) atomic force microscope image, showing meandering features of the grain boundary.
Figure 2B:
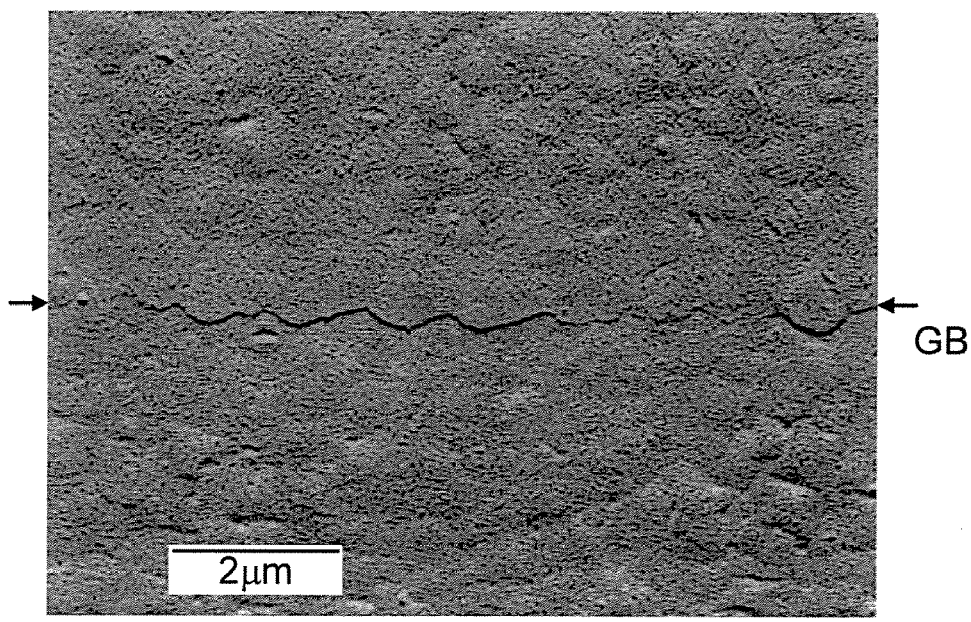

To observe a planar view, the bicrystal samples can be cut into 3 mm diameter discs with the boundary at the center, followed by mechanical grinding from the backside of the substrate to 100 µm thick. Then the samples can be dimpled (i.e., made thinnest at the center) to 20 µm thick in the center and ion-milled to perforation from the substrate side. Since the transmission electron microscopy (TEM) technique requires destruction of the sample, nondestructive techniques such as scanning electron microscopy (SEM) and atomic force electron microscopy (AFM) can be employed to provide information of the overall boundary structure. Using AFM and SEM the grain boundaries of the YBCO thin film were analyzed to determine whether they were straight as assumed based on thermodynamic stability. The results indicate that the YBCO grain boundaries prepared with an island type film growth mode is not straight, but meanders on the microscopic scale. For example, FIGS. 2(*a*) and 2(*b*) show the AFM and SEM images, respectively, of the 14/18 boundary (i.e., $\alpha_1=14°$ and $\alpha_2=18°$). As shown in the images, the meandering of the boundary is on the length scale of a few hundred nanometers to 1 µm. The remaining boundaries show similar meandering nature, but the degree of meandering is different from boundary to boundary.

Figure 3A:
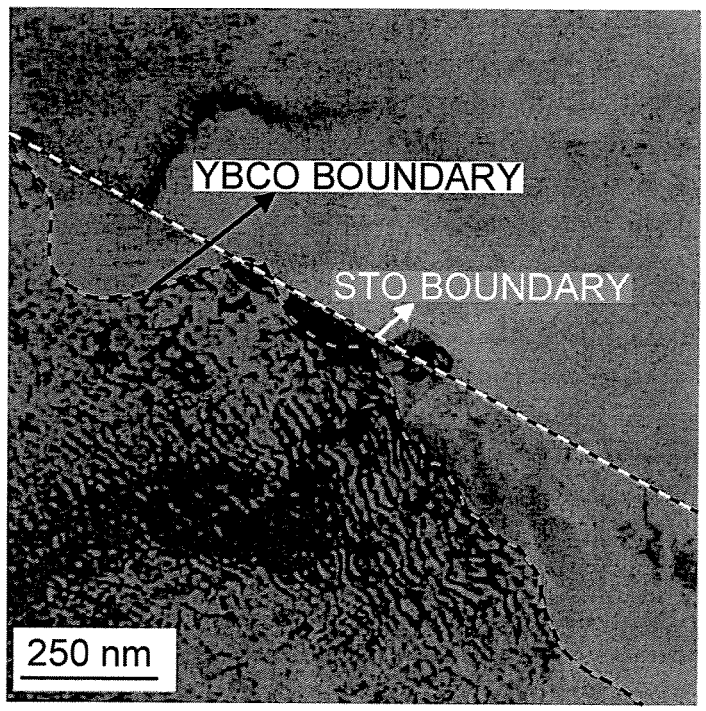
FIG. 3 shows (a) a bright field image and (b) a dark field image obtained by transmission electron microscopy of the 14/18 grain boundary showing the meandering of the YBCO film boundary and the straight STO substrate grain boundary.
Figure 3B:
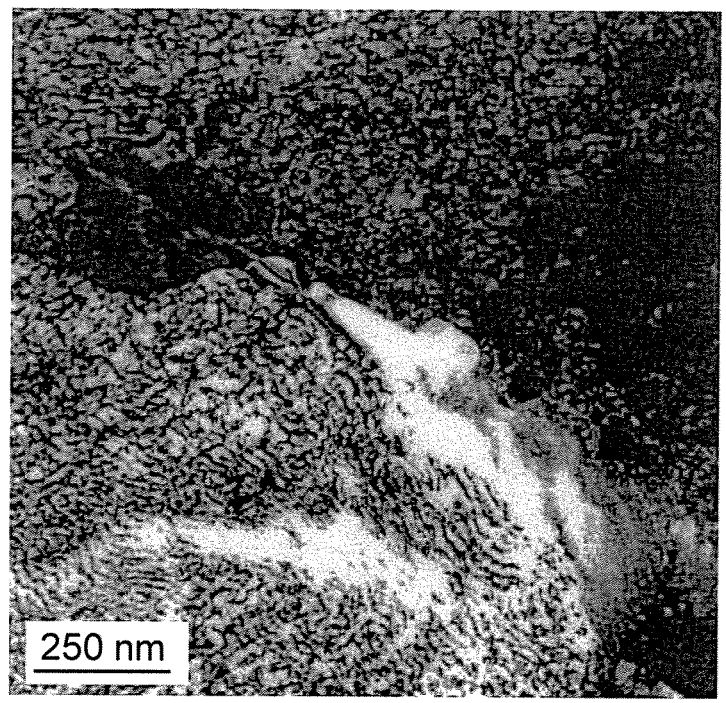
Figure 4:
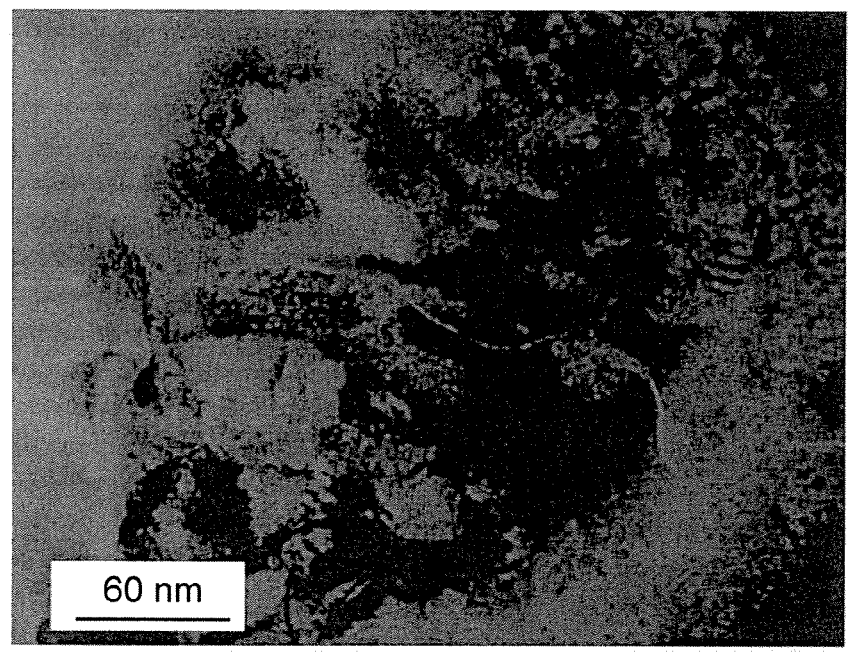
FIG. 4 is a bright field image of the 26/14 grain boundary showing the meandering of the YBCO film boundary.

Planar view TEM studies of the grain boundaries confirmed the SEM and AFM observations. FIGS. 3*a* and 3*b* show the low magnification bright field and dark field TEM images, respectively, of the 14/18 grain boundary. To compare the film grain boundary with the substrate boundary, the TEM sample of the boundary can be carefully ion-milled so that the substrate coexists with the film layer while the sample is electron transparent. As shown, the combination of bright field and dark field image clearly identifies the location of the grain boundaries of both the film and the substrate. In FIG. 3*a*, the lower-left YBCO crystal appears dark with Moiré fringes and the top-right YBCO crystal appears brighter. The Moiré fringes arise from double diffraction between the crystal-pair of YBCO film and STO substrate. It is clear that the YBCO boundary is wavy whereas the substrate boundary is relatively straight. The meandering YBCO grain boundary loosely follows the path defined by the substrate (template) grain boundary. Along its entire length, the position of the YBCO boundary deviates significantly from the underlying boundary of the substrate. This deviation is found to be 300 nm for the 14/18 grain boundary. The magnitude of the grain boundary deviation also varies between different grain boundaries. As an example, FIG. 4 shows that the zigzagging of the YBCO grain boundary seems to deviate less from the substrate boundary for the 14/26 grain boundary. This suggests that the amplitude of the deviations is somewhat dependent on the grain boundary misorientation and geometry. Since the substrate has been ion-milled away, only the wavy 26/14 YBCO grain boundary is shown in FIG. 4. The amplitude and periodicity of the wavy patterns were respectively up to 30 nm and about 100 nm for this boundary. The overall microstructural features of the 11/18, 0/26, 11/26 and 18/26 YBCO bicrystal film boundaries were similar to those observed in the 14/18 and 14/26 boundaries, suggesting meandering of the epitaxially grown film boundary is a general phenomenon.

High resolution transmission electron microscopy (HRTEM) can also be employed to provide atomic scale structure of the grain boundary. Because the YBCO and STO are similar in lattice spacing and in structure in the ab-plane, it is difficult to distinguish the two from diffraction patterns and/or from high-resolution lattice images. The meandering feature at low magnification combined with the twin structure can thus be used as an indicator of the YBCO boundary. The YBCO twin width observed varies between 30 and 50 nm. Analyses of the electron diffraction patterns indicate that for all the bicrystals investigated, the misorientation angle of the film grain boundary is in accordance with the misorientation angle of the underlying substrate.

Figure 5:
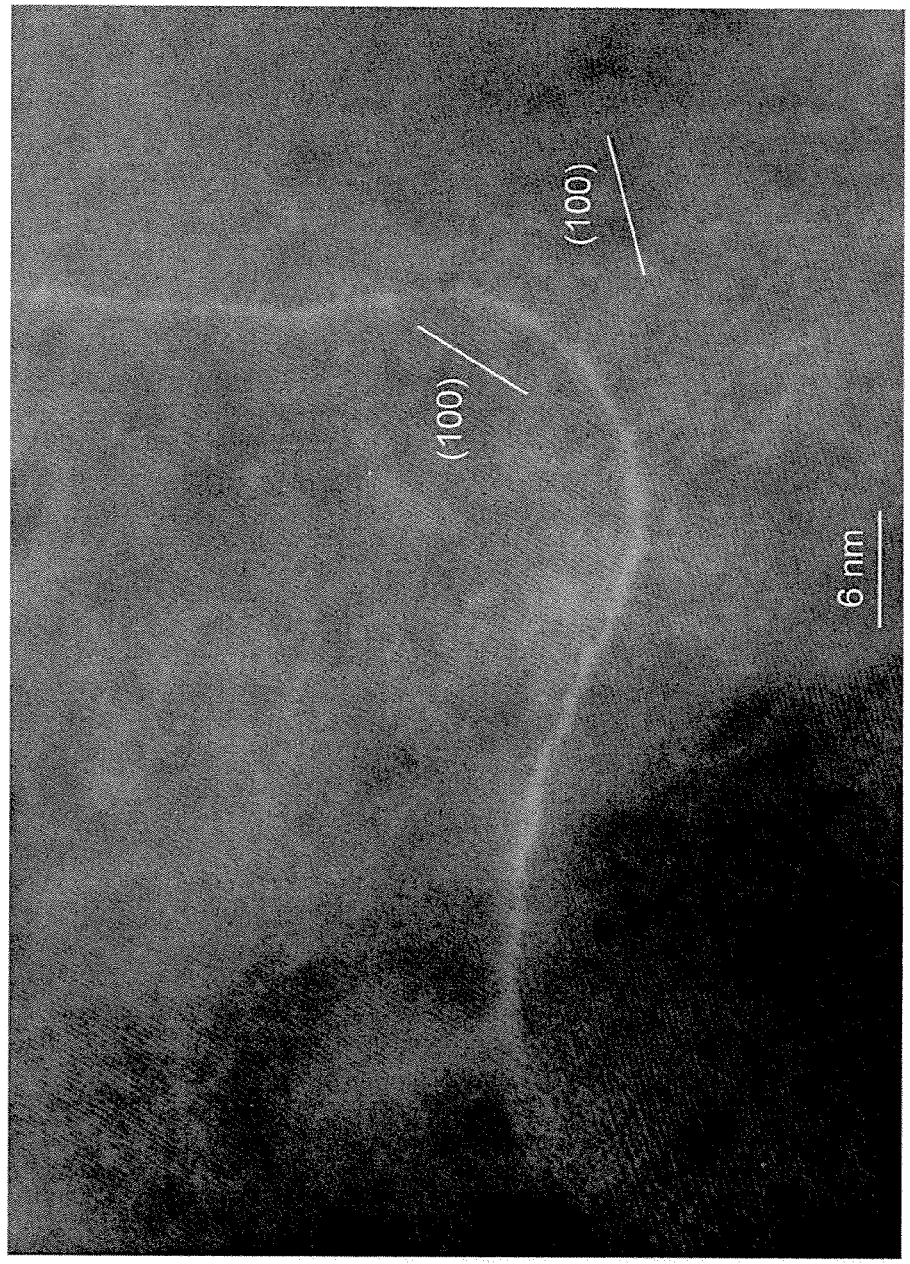
FIG. 5 is a large area high resolution transmission electron microscope (HRTEM) image of the 26/14 YBCO grain boundary, confirming the meandering nature of the boundary.

FIG. 5 shows a large area HRTEM lattice image of the 26/14 grain boundary. The (100) lattice planes on both sides of the boundary clearly illustrate the meandering nature of the YBCO boundary. The actual boundary plane does not change continuously but rather changes abruptly from an atomically flat crystallographic plane to a crystallographic plane along the grain boundary that accommodates the local waviness. Higher magnification lattice images indicate that the YBCO grain boundaries are very clean, with no continuous secondary phases at the grain boundaries. Moreover, the meandering of the boundaries consist of many straight segments of different boundary inclinations or facets.

Figure 6A:
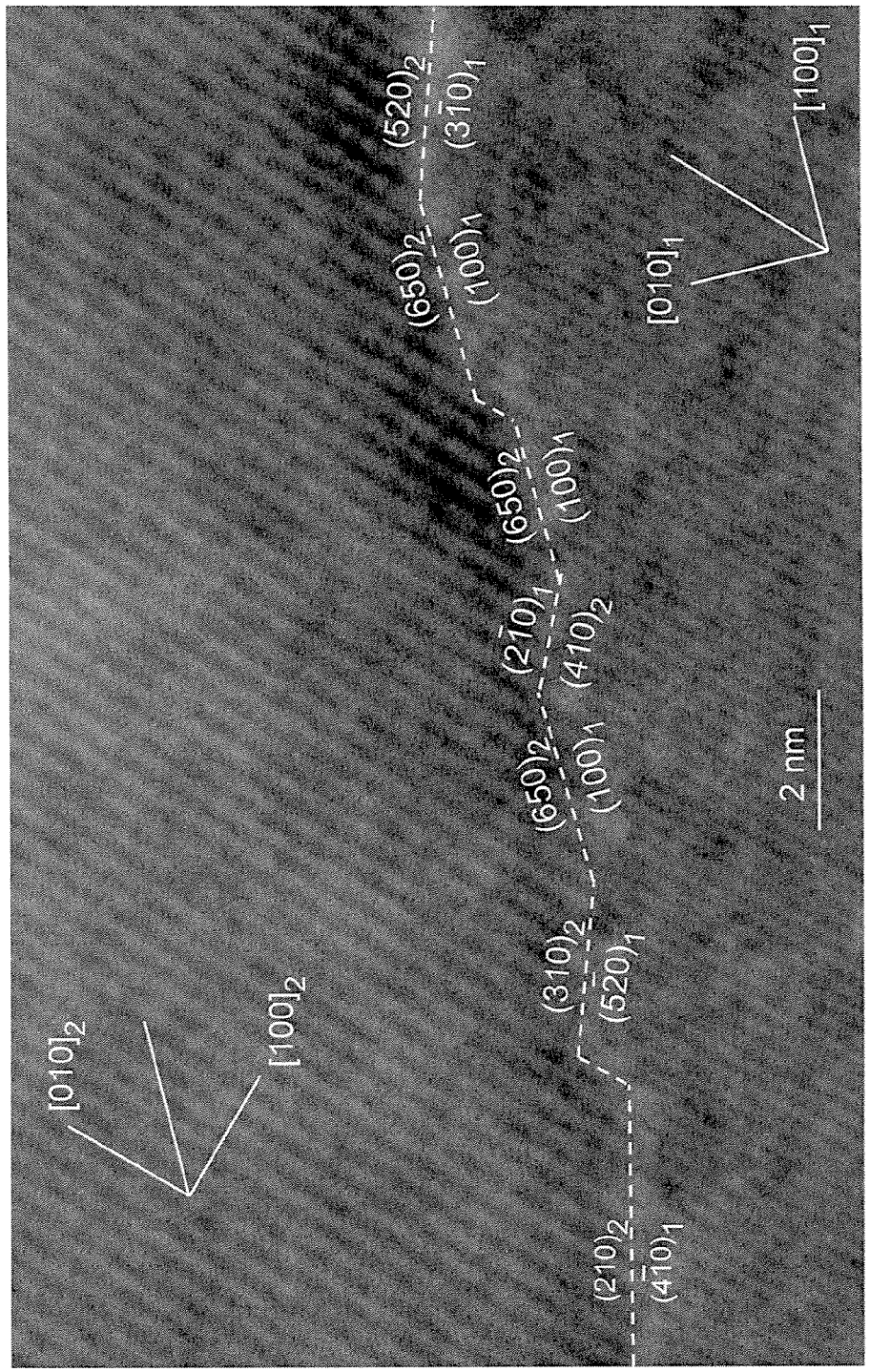
FIG. 6(*a*) is an HRTEM image of the YBCO grain boundaries showing faceting along the 26/14 boundary.
Figure 6B:
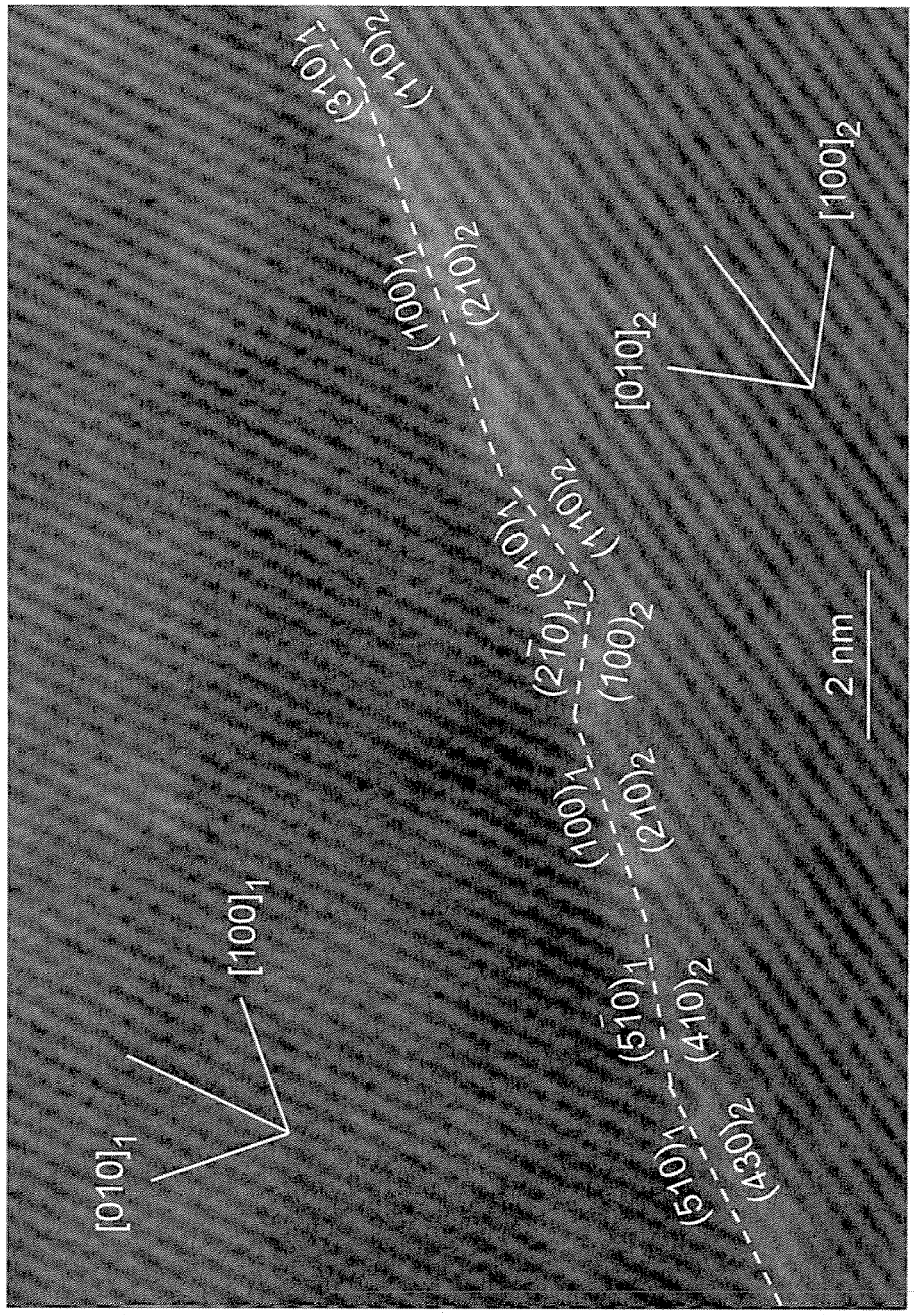
Figure 6C:
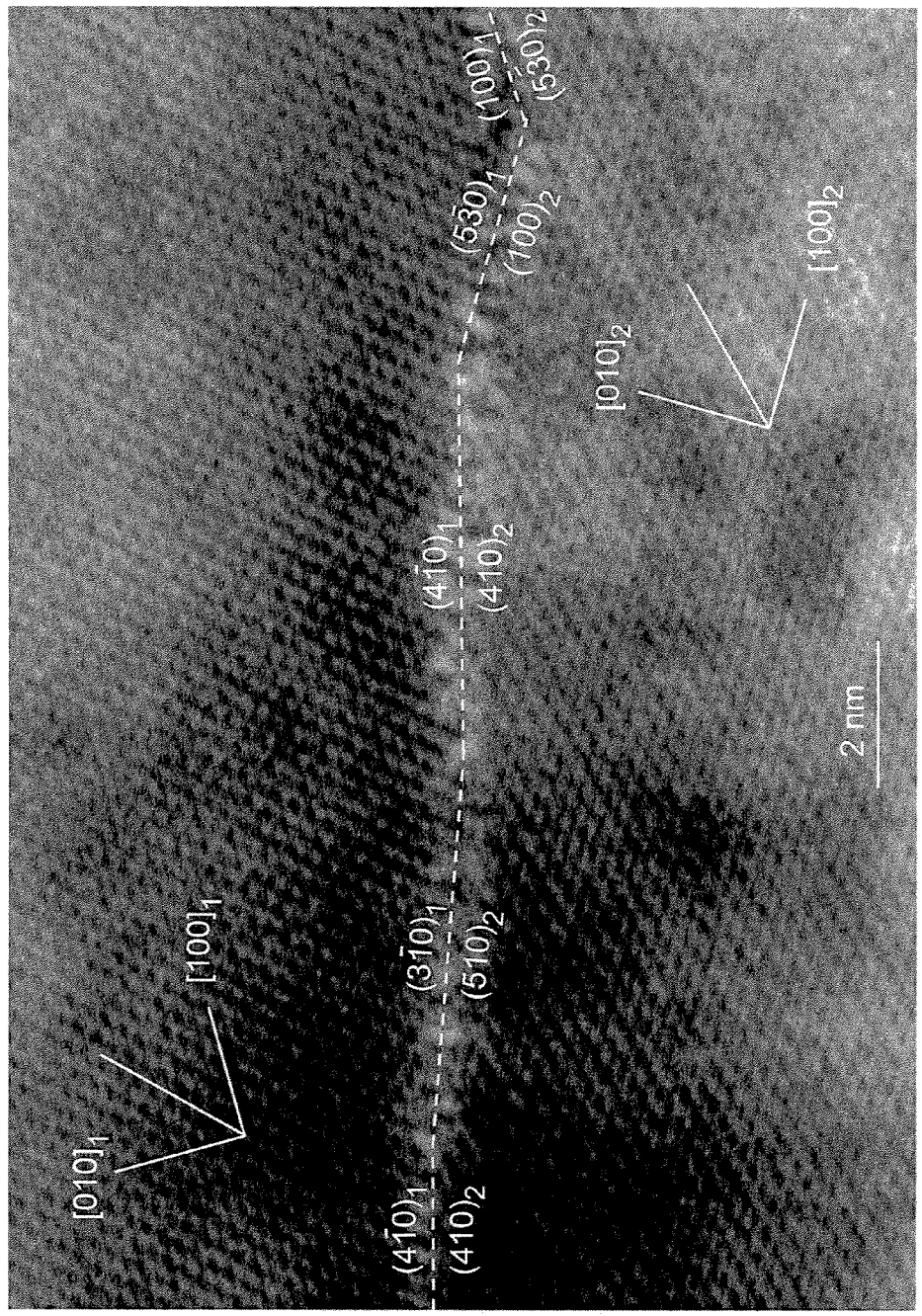
Figure 6D:
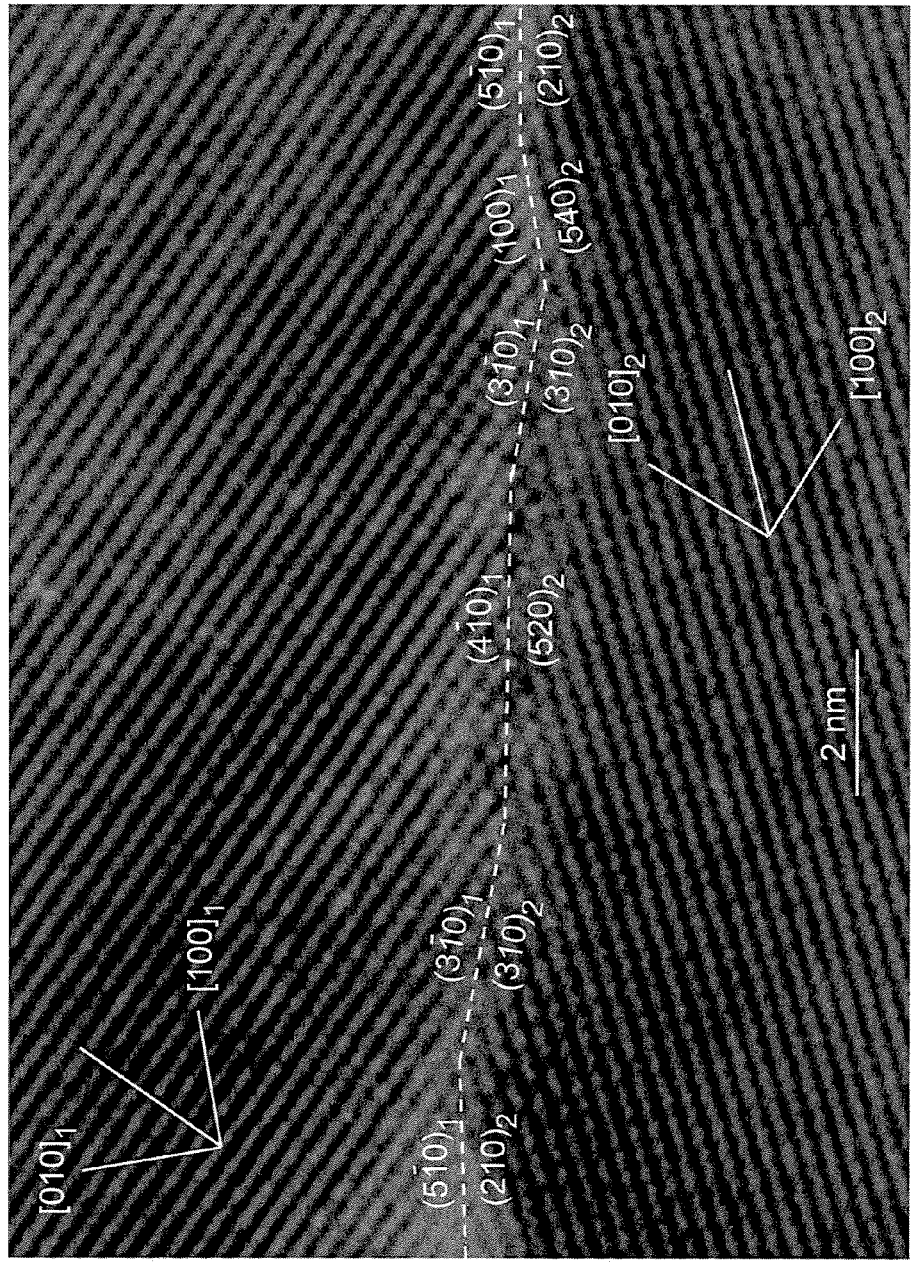
Figure 6E:
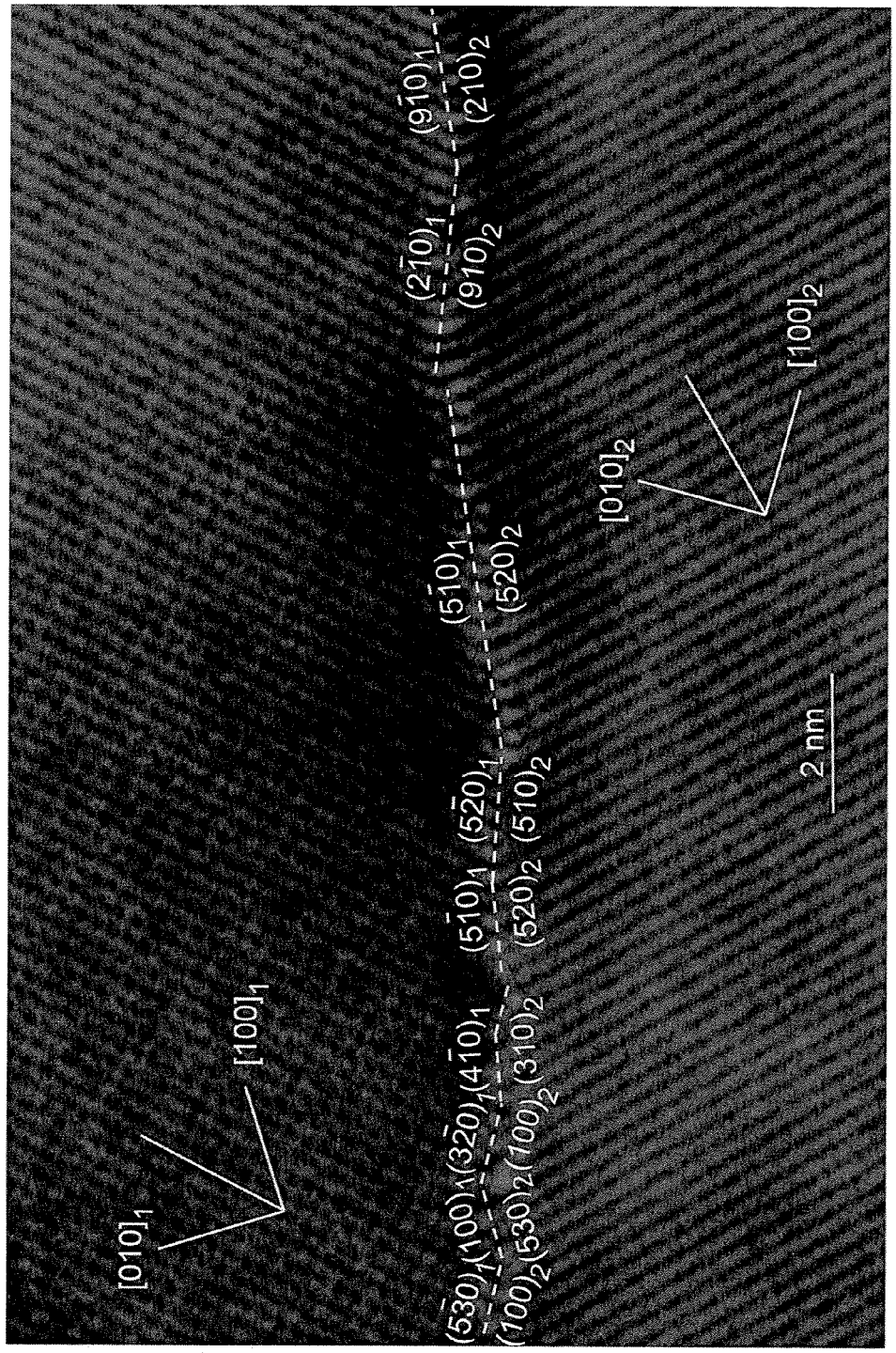
Figure 6F:
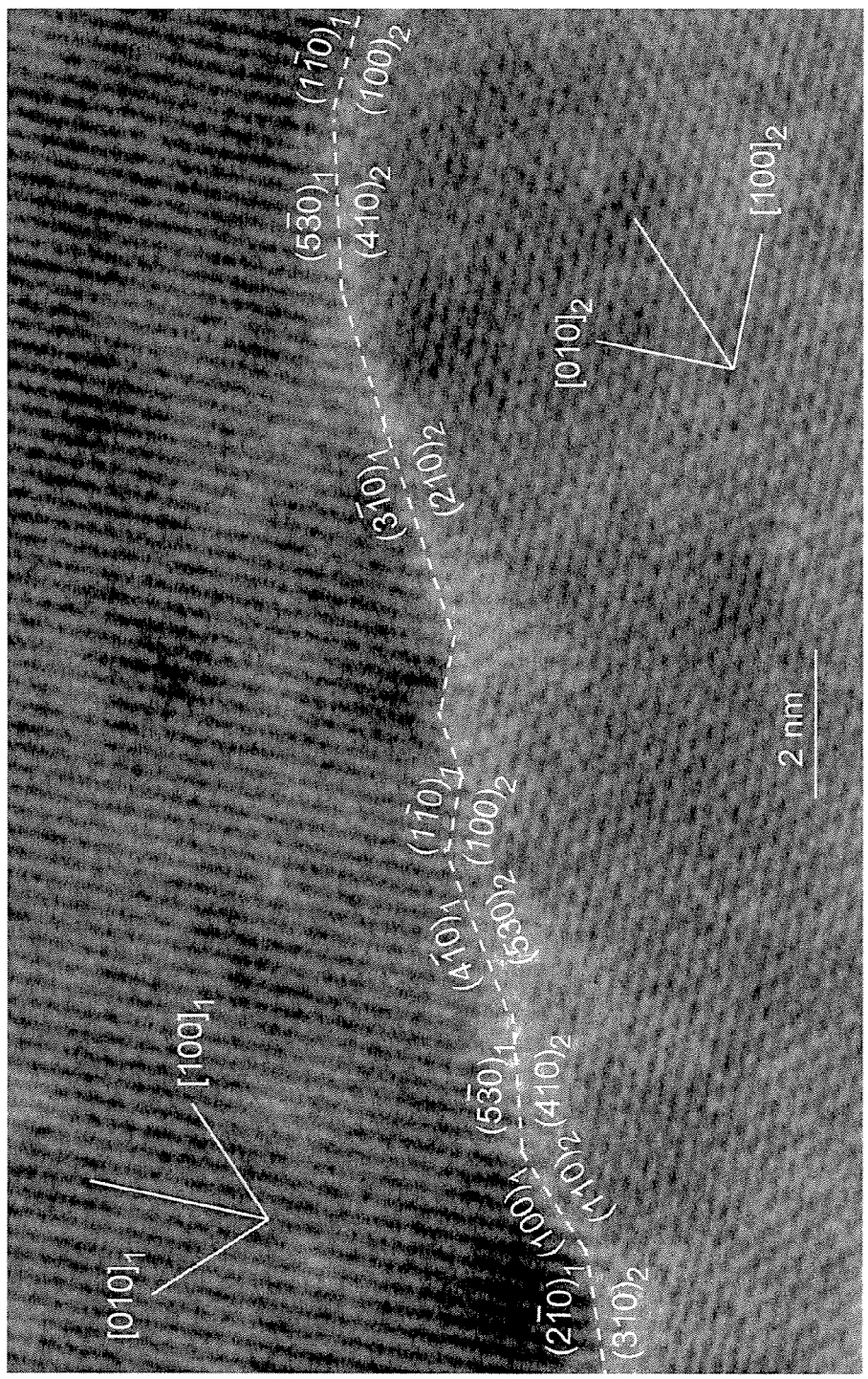

FIG. 6a is an enlarged image of a small part of FIG. 5. An abrupt lattice discontinuity on both sides of the boundary is observed without visible changes of structure except at the boundary core. The disordered structure at the grain boundary is in general a few interatomic spacings from the interface and does not vary significantly with misorientations. Facet planes of (210)/(410), (100)/(650), (310)/(520) and (100)/(540) are observed, that reappear from segment to segment along the boundary. The lengths of the facets are usually in the range of a few nanometers.

Similar features are also observed for the other grain boundaries, with the facet planes varying with grain misorientation and boundary geometry, as shown in FIGS. 6(b)-6(f). A boundary length of about 90 nm can be used to collect the facet data for each grain boundary and are compiled in Table 2. A negative value of α occurs when the grain boundary plane, shown schematically in FIG. 1(b), is oriented beyond the angle formed by the a-axes of the two crystals. Additionally, for all the grain boundaries, it was found that the image contrast near the grain boundary is enhanced compared with the internal grains. This enhanced contrast may be due to specimen thickness variations resulting from the preferential thinning at the grain boundary by ion milling and/or due to composition variations at the grain boundary, such as copper enrichment and oxygen depletion at the YBCO grain boundary. In comparison, this enhanced contrast layer is much thinner than the insulating segregation layer observed in $Ba_{1-x}K_xBiO_3$ Josephson grain boundaries.

The meandering of the grain boundary at the microscopic level can be attributed to the island growth mode of YBCO films, which will cause faceting of the film. Islands of YBCO grains nucleate on both sides of the STO boundary. As these grains/islands grow and impinge against other grains/islands that nucleated on the other side of the STO grain boundary, a microscopic meandering boundary of YBCO is formed. On a finer scale, the meandering boundary is made up of straight atomistic facets of a few nanometers. The corresponding crystallographic planes of the facets in each of the two abutting grains are dependent on the grain misorientation and the boundary inclination of the original design (i.e., the substrate template), as may be seen in Table 2. The competing mechanisms controlling the facet formation along a given grain boundary is determined on the basis of three criteria. First, the boundary plane has to be defined by Miller indices in both crystals. Assuming [001] tilt boundaries, the only allowable boundary planes are (hk0)'s, where h, k are small integers. Second, the sum of the angles of [100] axes of the two crystals with respect to the boundary plane has to be equal to or extremely close to the misorientation angle, i.e., $\alpha_1+\alpha_2=\theta$. Third, the grain boundary can not wander too far from the originally designed plane.

Figure 7:
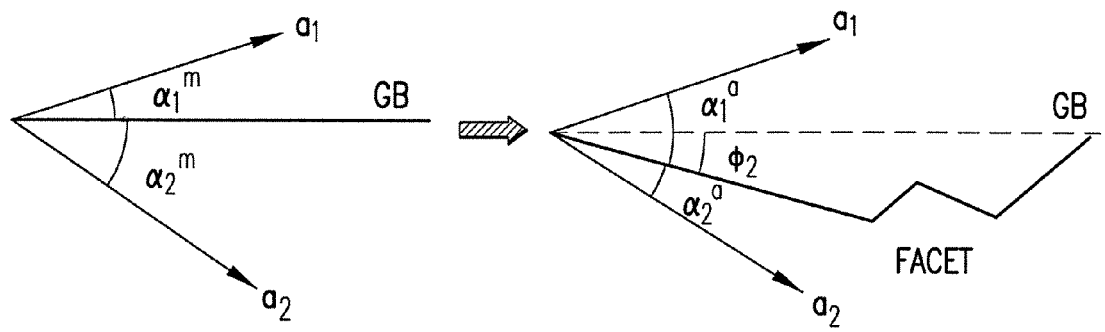
FIG. 7 is a schematic diagram showing a straight grain boundary faceted into several segments of low energy boundary inclinations. $\alpha_1^m$ and $\alpha_2^m$ are macroscopic (designed) inclination angles of the boundary plane with respect to crystal 1 and 2. $\alpha_1^a$ and $\alpha_2^a$ are local (atomistic) inclination angles of the boundary plane with respect to crystal 1 and 2. $\phi_a$ is the local angular deviation from the design boundary. These angles are correlated by $\alpha_1^a=\alpha_1^m+\phi_a$ and $\alpha_2^a=\alpha_2^m-\phi_a$.
Figure 8:
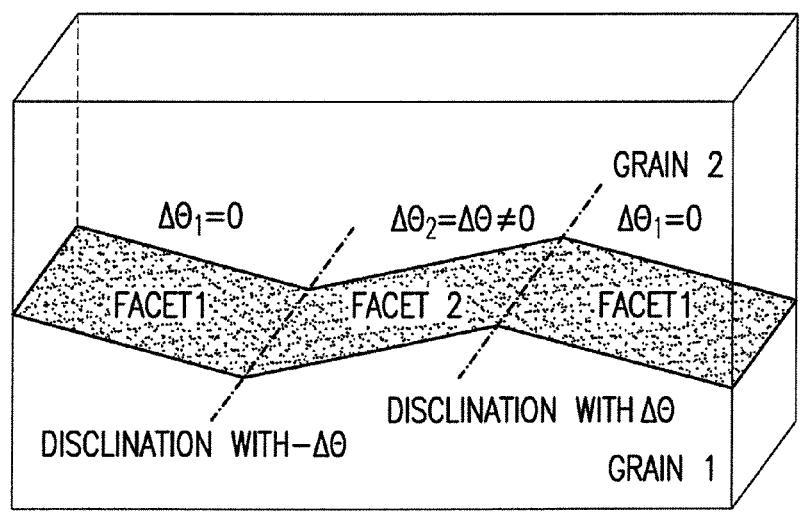
FIG. 8 is an exemplary diagram showing a grain boundary (shaded regions) with a $\Delta\theta\neq0$ facet segment forming two disclinations at the two ends of the segment.
Figure 9A:
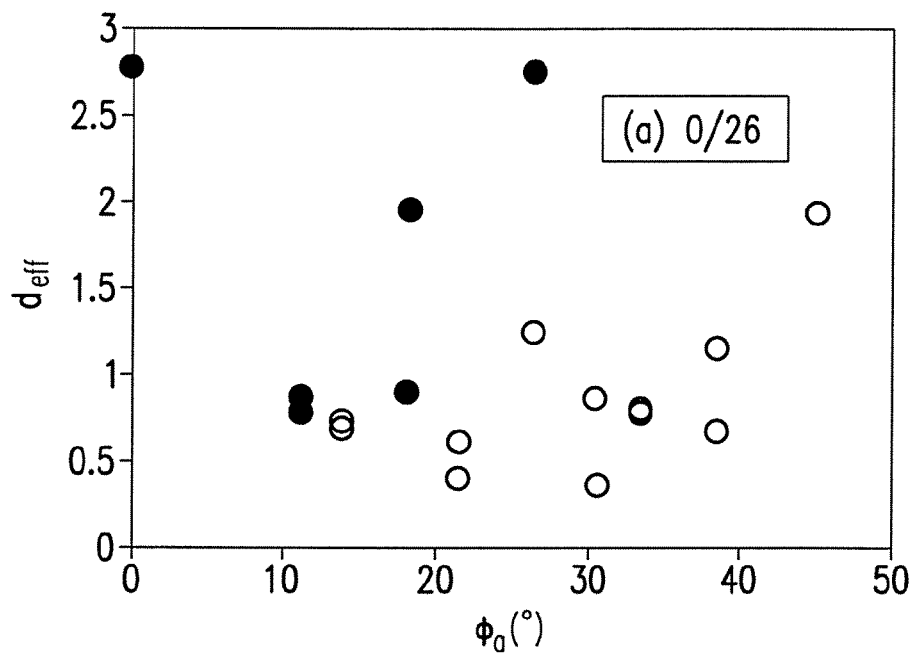
FIG. 9(*a*) is a graphical plot showing a comparison between the experimentally observed facets (black dots) and the allowable facets not observed (small circles), $\Delta\theta>3°$, calculated based on a faceting mode for a designed inclination angle ratio ($\alpha_1^m/\alpha_2^m$) of 0/26.
Figure 9B:
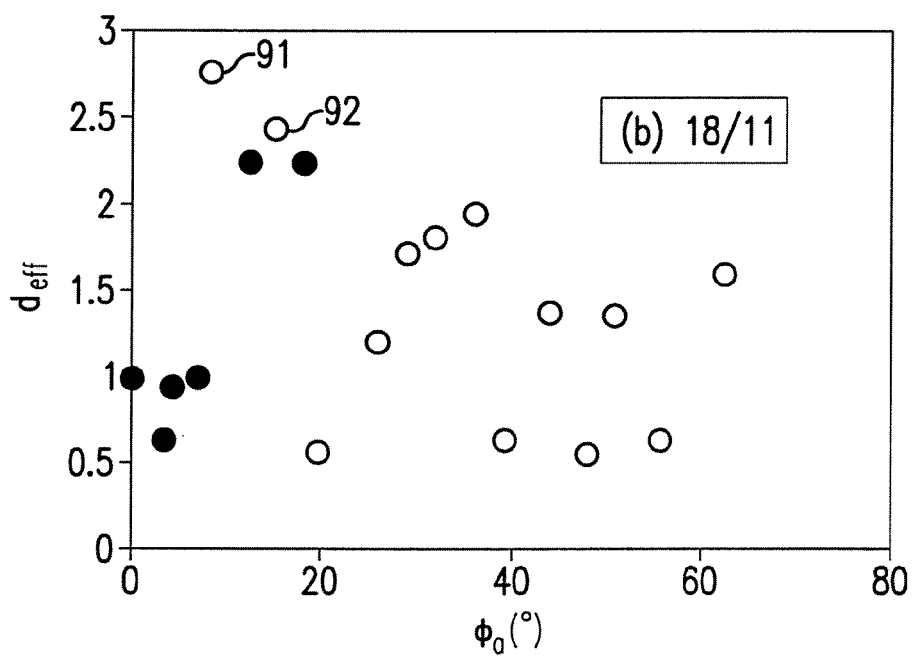
Figure 9C:
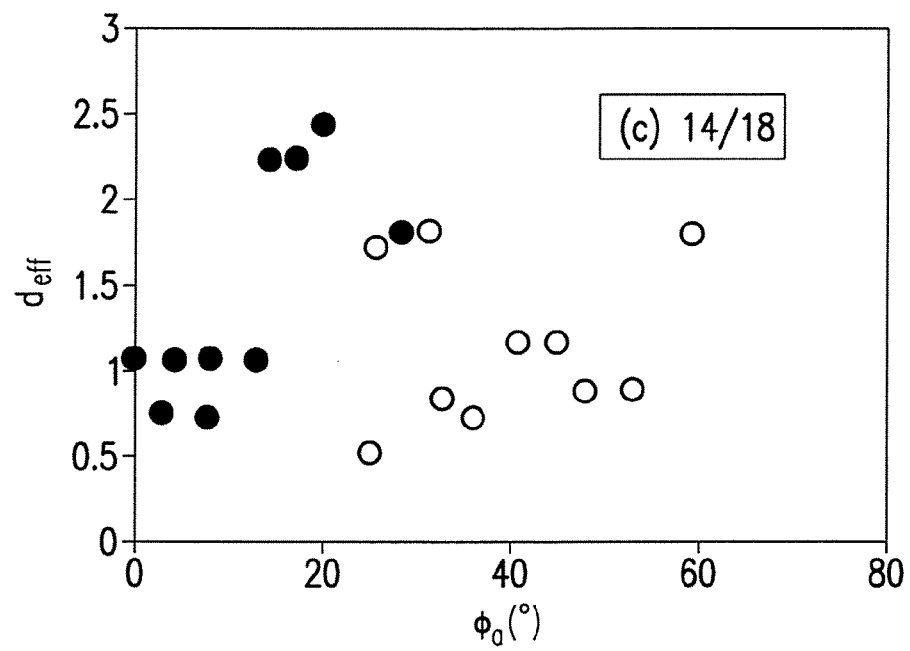
Figure 9D:
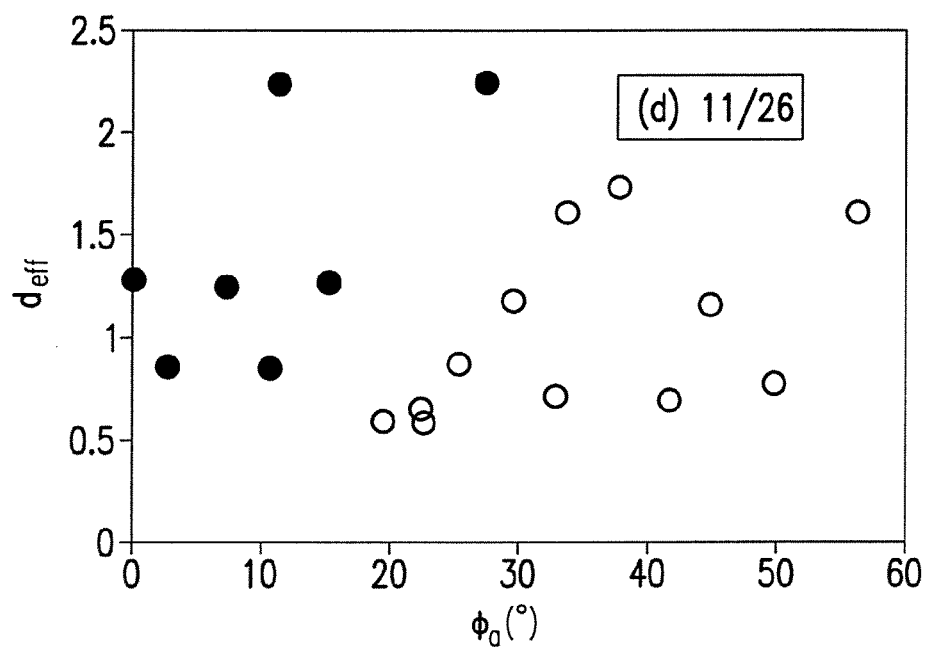
Figure 9E:
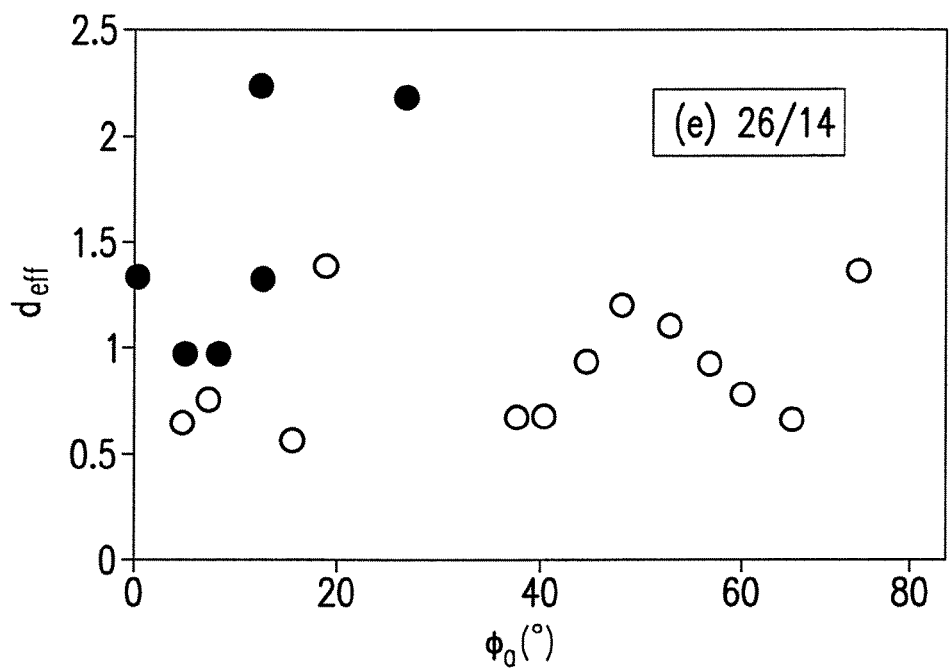
Figure 9F:
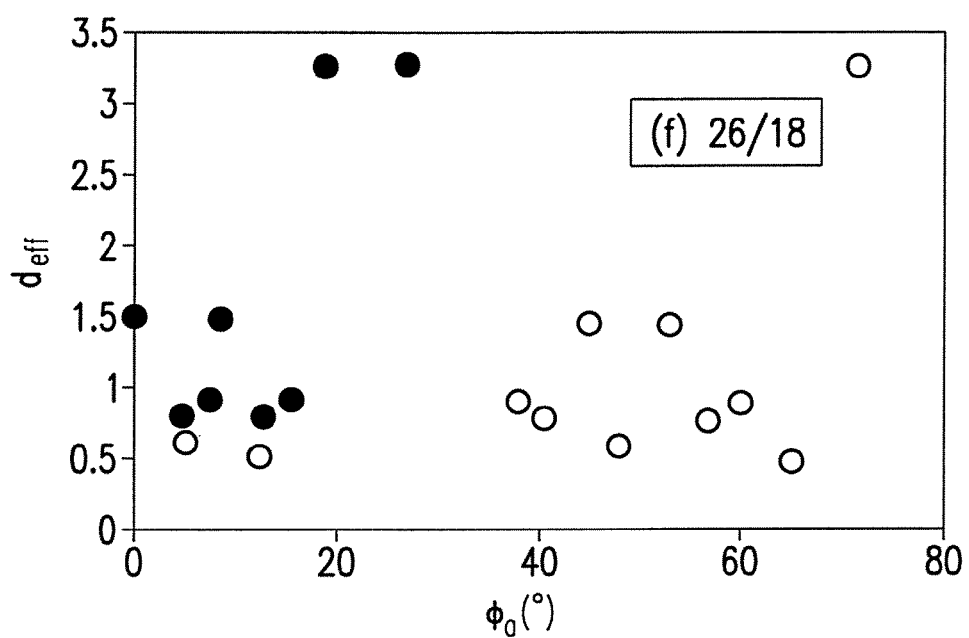

Based on the first criterion, all the allowable facets with low (hk0) for each grain boundary can be calculated. The results of these calculations are tabulated in Tables 3-8. In the calculations, the absolute values of h and k have been arbitrarily cut off at 5 for Miller indices of facets in crystal 1, i.e., $|h_1|\leq 5$ and $|k_1|\leq 5$. The corresponding $h_2$ and $k_2$ values of the facets in crystal 2 are thus obtained based on the second criterion, since the facet plane has to be low indexed in at least one of the crystals to maintain a low energy. Furthermore, both $(h_1, k_1, 0)$ and $(-h_1, k_1, 0)$ have been used in the calculations since all the exemplary grain boundaries are asymmetric. A schematic of grain boundary faceting and the notation used in the calculations are shown in FIG. 7. $\alpha_1^a$ and $\alpha_2^a$ are the new inclination angles (i.e., the inclination angles in the first and second grains of the YBCO film which define the faceted boundary while the design inclination angles in crystals 1 and 2 of the substrate are $\alpha_1^m$ and $\alpha_2^m$, respectively. The $\phi_a$ is the angle deviated by the facet from the design boundary. The Miller indices of the facet plane in crystal i are thus given by $k_i^a/h_i^a=\tan(\alpha_i^a)$ where h and k are integers. Without energy values of the facets, the effective d-spacing ($d_{eff}$) can be used as an indicator of the boundary energy and can be obtained by averaging the d-spacing of the boundary plane in both crystals. For example, the $d_{eff}$ of the facet plane $(h_1k_10)_1/(h_2k_20)_2$ is the average of d-spacings of $(h_1k_10)$ and $(h_2k_20)$ planes. Larger $d_{eff}$ suggests lower facet energy since an atomic plane with a large value of d-spacing has in-plane atoms that are more closely packed. Considering the conservation of local coordination numbers, the bonding between close-packed planes is therefore the weakest. Furthermore, computer simulations of a number of periodic (Σ) boundaries, shows that facets with large $d_{eff}$ are more energetically favored. Although there is no direct analytical formula to link $d_{eff}$ with grain boundary energy of the facets, $d_{eff}$ nevertheless gives a baseline for comparison. Therefore, $d_{eff}$ can be used to determine which facets are most likely to occur. The sets of probable facets are listed with their corresponding d-spacings in Tables 3-8. Accordingly, facets with low energies (i.e., large $d_{eff}$) are the most likely to occur during island impingement. The range of $d_{eff}$ observed, 0.63 to 3.29 Å, and the closure failure defined by $\Delta\theta=|(\alpha_1^a+\alpha_2^a)-\theta|$ are listed in Tables 3-8. As shown schematically in FIG. 8, each occurrence of closure failure will be taken up as disclinations at the two end-points of the particular facet segment having a stress-field and thereby an elastic energy.

Extensive microstructural characterizations of a series of YBCO [001] tilt boundaries have revealed several features of the grain boundary structure. The atomic order at the grain boundary is perturbed within two atomic distance from the interface. All six exemplary boundaries show an abrupt change of lattices at the boundary line with at most one to two disordered atomic layers. The meandering of the YBCO grain boundary supports an island growth mechanism of the films, which can be avoided by using a layer-by-layer growth mode. In an example of an island growth mode, the YBCO films were prepared by sputtering at a medium deposition vacuum and a high substrate temperature. The islands first nucleate at various points on the substrate and then grow laterally as the deposition of the film progresses. The periodicity of the wavy patterns of the grain boundary observed, as shown in FIG. 4, corresponds directly to the island size in the YBCO films. The continued growth of the film across the substrate boundary suggests that the difference in energy between the epitaxial and non-epitaxial film/substrate interfaces is not significant in the growth process. A non-epitaxial film/substrate interface is an interface between an island that nucleated on one side of the substrate boundary with the substrate surface on the other side of the boundary.

Furthermore, the faceting of the grain boundary occurs to accommodate the twists and turns in the meandering of the boundary. The experimentally observed facets have been identified within the list of the allowable facets in Tables 3-8. Moreover, faceting only occurs along those planes which are either energetically favorable and/or inclinationally favorable. For example, if the effective d-spacing is relatively large and the deviation angle of the facet plane from the original template boundary (i.e., $\phi_a$) is relatively small. To illustrate the faceting characteristics, FIGS. 9(*a*)-9(*f*) show the faceting data plotted as the effective d-spacing ($d_{\mathit{eff}}$) vs. the deviation angle ($\phi_a$). Among the allowable facets, the observed facets are distributed in the upper left corner of FIGS. 9(*a*)-9(*f*) for all the boundaries investigated, indicating high values of d-spacing and low deviation angles. Higher values of $d_{\mathit{eff}}$ seem to give more tolerance to the deviation angles. The deviation angles of the observed facets were found up to 28°. While the high $d_{\mathit{eff}}$ indicates the low boundary energy, the small deviation angles imply that the grain boundary tends to stay close to the design inclination during faceting. In addition, the length scale of the wavy pattern of the YBCO grain boundary depends on the island size. Both the areas of the non-epitaxial film/substrate interfaces and the length of the film boundary will be minimized if all the facets tend to stay close to the design template boundary inclinations. Therefore, the observed facets will have relatively low deviation angles ($\phi_a$'s), even though some short segments of high deviation angles may occasionally be observed, such as those shown in FIG. 6(*a*). These high-$\phi_a$ segments can be considered as steps between facets. In addition to the effective d-spacing ($d_{\mathit{eff}}$) and the deviation angle ($\phi_a$), the third factor controlling the facet formation is the closure failure ($\Delta\theta$). $\Delta\theta$ needs to be minimized to reduce the strain energy involved, with the ideal value being zero. FIG. 9(*b*) shows the facet data for the 18/11 boundary. Two data points 91 and 92 located in the very upper left corner of the figure, denoted as small circles, are not observed although they have very high values of $d_{\mathit{eff}}$ and low deviation angles. This is due to their high values of $\Delta\theta$ (3.17° and 3.95° respectively). For the other five exemplary boundaries 0/26, 14/18, 11/26, 26/14 and 26/18, plots of $d_{\mathit{eff}}$ versus $\phi_a$ shown in FIGS. 9(*a*), 9(*c*)-9(*f*) allow the formation of the observed facets to be predicted. The small $\Delta\theta$'s observed are inherent to the selected boundaries with design inclination angles already satisfying $\alpha_1^m + \alpha_2^m = \theta$, tan $\alpha_1^m = k_1^m / h_1^m$ and tan $\alpha_2^m = k_2^m / h_2^m$. Therefore, the effect of $\Delta\theta$ on the facet formation of the five exemplary boundaries 0/26, 14/18, 11/26, 26/14 and 26/18 is less dominant since the $\Delta\theta$ values for all the probable facets are smaller than about 2°. In addition, twinning adds about ±0.9° to local orientation abating the effect of $\Delta\theta$. The small $\Delta\theta$'s explain the higher Jc drop-off misorientation, $\theta=30°$ as measured by SSM than previously reported Jc ($\theta$).

Despite an apparently favorable substrate boundary geometry, many facets (a few nanometers in length) with different crystallographic orientations are observed. The results suggest that the YBCO grain boundary faceting is a general phenomenon when grains of different orientations abut, which can be avoided by using a layer-by-layer film growth mode. The presence of the facets with relatively low boundary energy indicates that the two crystals managed to adjust to low-energy boundary configurations nanoscopically. However, the waviness of the meandering boundaries and the multiple facets observed suggest that the boundaries are not in an equilibrium configuration on the microscopic scale. Facets may form after coalescence of the two YBCO grains as a relaxation of the grain boundary energy by local boundary migration. It is also likely that the growth fronts of the YBCO islands undergo faceting with the results of faceted boundary when the growth islands coalesce. The probability of the latter case is demonstrated by the fact that all the facets observed have relatively low deviation angles from the original template boundaries.

The presence of facets at a grain boundary will affect the electrical properties across this grain boundary. The d-wave symmetry of the tunneling current across a Josephson junction or a grain boundary was first theorized by Sigrist and Rice (S-R). Assuming that the S-R model is still valid for the microscopic facets or even nanoscopic facets, the local faceted planes will alter the phase and the magnitude of the tunneling characteristics. The effect of the facets on the critical current density ($J_c(\alpha)$) is analyzed by calculating $\cos 2\alpha_1^a \cos 2\alpha_2^a / \cos \phi_a$ and the results are listed in the last column of Tables 3-8. Here $1/\cos \phi_a$ accounts for the elongation of a facet boundary compared with the designed boundary in the bicrystal substrate. The value of $J_c(a)$ varies significantly with the facets, with negative currents across certain facets. With some of these facets being bona fide π-junctions, the two end-points of each π-junction can each spontaneously generate a half flux-quantum. Due to the nonuniform distribution of local critical currents flowing across the grain boundary, it is reasonable to suggest that the effective current across a grain boundary is determined by taking the summation of current contribution from individual facets. Since each facet corresponds to a different grain boundary plane which will have its own characteristic electrical properties, the bulk scale $J_c$ measurement of a given grain boundary represents the sum of all the facets and varies with the ratio of these facets along the grain boundary. As the growth of thin films is a non-equilibrium process, the length fraction of the facets will be sensitive to the growth parameters. It is reasonable to believe that grain boundary faceting will be a source of scatter and of inhomogeneous distribution of the transport properties along the grain boundaries as is often observed in the measurements.

The grain boundaries of YBCO films grown on STO substrates by sputtering and pulse laser deposition generally follow the straight substrate grain boundaries in millimeter to micrometer scale, but wavy in sub-micron scale and zig-zagged in nanoscale. The deviation amplitude of the film boundary from the substrate boundary has some dependence on the design boundary misorientation and geometry. This microscopic meandering nature of the film boundary is caused by the island growth mode of the YBCO films on STO substrates. The meandering of the boundary consists of many straight segments of nanofacets. There are three competing factors controlling the facet formation. First, the boundary energy has to be relatively low, usually with low hkl values in at least one of the crystals with large effective interplanar spacing. Second, the designed template boundary controls to some extent the facet planes. The grain boundary tends to facet on the crystallographic planes with relatively low deviation angles from the design boundary plane (i.e., $\phi_a$ small).

Third, the disclosure angle (Δθ) has to be very small (usually less than 2°), i.e., the summation of the angles of crystallographic axes of the two crystals with respect to the boundary plane has to be equal to or close to the misorientation angle. The grain boundary faceting indicates that an apparent grain boundary junction actually consists of many isolated nano-sized junctions within a "single" boundary. To avoid grain boundary faceting, a straight bicrystal grain boundary can be prepared by using a layer-by-layer growth mode of the thin film. The resulting thin films will have uniform superconducting properties and allow the preparation of films with reproducible junction currents.

It is to be understood that while the invention has been described in conjunction with the detailed description hereof, the foregoing description is intended to illustrate and not limit the scope of the invention, which is defined by the scope of the appended claims.

I claim:

1. A method of forming an atomistically straight grain boundary in a bicrystal epitaxial film formed on a surface of a substrate, comprising the steps of:
   (a) preparing a bicrystal substrate having a straight grain boundary as a template, wherein the misorientation angle of a first and a second crystal of the bicrystal substrate is straight; and
   (b) depositing the film on the substrate using a layer-by-layer growth mode so that the boundary between the grains of the film is atomistically straight.

2. The method according to claim 1, wherein said layer-by-layer growth mode of the film is achieved by a technique selected from the group consisting of solution coating, liquid phase epitaxy, molecular beam epitaxy, and chemical vapor deposition.

3. The method according to claim 1, wherein said film is a high temperature super-conducting oxide film.

4. The method according to claim 1, wherein said film is selected from the group consisting of a yttrium barium copper oxide and bismuth calcium strontium copper oxide.

5. The method according to claim 1, wherein said substrate is a strontium titanium oxide.

6. The method according to claim 1, wherein said film is deposited layer-by-layer stoichiometrically.

7. The method according to claim 1, wherein said film is deposited with a layer thickness less than 1 μm.

8. A device comprising an atomistically straight grain boundary in a bicrystal epitaxial film formed on a surface of a substrate, the film formed by a process comprising the steps of:
   (a) preparing a bicrystal substrate having a straight grain boundary as a template, wherein the misorientation angle of a first and a second crystal of the bicrystal substrate is straight; and
   (b) depositing the film on the substrate using a layer-by-layer growth mode so that the boundary between the grains of the film is atomistically straight.

9. The device according to claim 8, wherein said layer-by-layer growth mode of the film is achieved by a technique selected from the group consisting of solution coating, liquid phase epitaxy, molecular beam epitaxy, and chemical vapor deposition.

10. The device according to claim 8, wherein said film is a high temperature super-conducting oxide film.

11. The device according to claim 8, wherein said film is selected from the group consisting of a yttrium barium copper oxide and bismuth calcium strontium copper oxide.

12. The device according to claim 8, wherein said substrate is a strontium titanium oxide.

13. The device according to claim 8, wherein said film is deposited layer-by-layer stoichiometrically.

14. The device according to claim 8, wherein said film is deposited with a layer thickness less than 1 μm.

15. A device including a high-Tc superconductor, comprising:
   (a) a bicrystal substrate template having a straight grain boundary, wherein the misorientation angle of a first and a second crystal of the bicrystal substrate is straight; and
   (b) a bicrystal epitaxial film on the substrate, the film deposited using a layer-by-layer growth mode so that the boundary between the grains of the film is atomistically straight.

16. The device according to claim 15, wherein said layer-by-layer growth mode of the film is achieved by a technique selected from the group consisting of solution coating, liquid phase epitaxy, molecular beam epitaxy, and chemical vapor deposition.

17. The device according to claim 15, wherein said film is a high temperature super-conducting oxide film.

18. The device according to claim 15, wherein said film is selected from the group consisting of a yttrium barium copper oxide and bismuth calcium strontium copper oxide.

19. The device according to claim 15, wherein said substrate is a strontium titanium oxide.

20. The device according to claim 15, wherein said film is deposited layer-by-layer stoichiometrically.

21. The device according to claim 15, wherein said film is deposited with a layer thickness less than 1 μm.

* * * * *

UNITED STATES PATENT AND TRADEMARK OFFICE
CERTIFICATE OF CORRECTION

| | | |
|---|---|---|
| PATENT NO. | : 8,016,943 B2 | Page 1 of 1 |
| APPLICATION NO. | : 11/945529 | |
| DATED | : September 13, 2011 | |
| INVENTOR(S) | : Siu-Wai Chan et al. | |

It is certified that error appears in the above-identified patent and that said Letters Patent is hereby corrected as shown below:

Column 1, line 22, please insert the following header and paragraph:

--Statement Regarding Federally Sponsored Research or Development
This invention was made with government support under grant number 9803212 awarded by the National Science Foundation. The government has certain rights in the invention.--

Signed and Sealed this
Thirtieth Day of October, 2012

David J. Kappos
*Director of the United States Patent and Trademark Office*